United States Patent
Katase et al.

(10) Patent No.: US 7,514,355 B2
(45) Date of Patent: Apr. 7, 2009

(54) MULTILAYER INTERCONNECTION STRUCTURE AND METHOD FOR FORMING THE SAME

(75) Inventors: Syuji Katase, Akiruno (JP); Kouichi Suzuki, Akiruno (JP); Kenji Chichii, Akiruno (JP); Katsuji Tabara, Akiruno (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/149,188

(22) Filed: Jun. 10, 2005

(65) Prior Publication Data

US 2005/0287800 A1 Dec. 29, 2005

(30) Foreign Application Priority Data

Jun. 24, 2004 (JP) ............................. 2004-187005

(51) Int. Cl.
*H01L 23/48* (2006.01)
*H01L 23/52* (2006.01)
*H01L 29/40* (2006.01)
*H01L 21/44* (2006.01)
*H01L 21/4763* (2006.01)

(52) U.S. Cl. ..................... 438/637; 438/652; 438/667; 257/750; 257/774; 257/E21.597

(58) Field of Classification Search ................ 438/596, 438/6, 652, 622–624, 637, 666–667, 672, 438/675; 257/773, 750, 758, 760
See application file for complete search history.

(56) References Cited

U.S. PATENT DOCUMENTS

| 5,139,963 | A | * | 8/1992 | Suzuki et al. .................. 438/4 |
| 5,497,034 | A | * | 3/1996 | Yamaguchi et al. ......... 257/741 |
| 6,046,097 | A | * | 4/2000 | Hsieh et al. .................. 438/584 |
| 6,262,487 | B1 | | 7/2001 | Igarashi et al. |
| 6,300,631 | B1 | * | 10/2001 | Shofner ...................... 250/311 |
| 6,555,469 | B1 | * | 4/2003 | MacIntyre .................. 438/637 |
| 2002/0197851 | A1 | * | 12/2002 | Gavish et al. .............. 438/637 |
| 2004/0099638 | A1 | * | 5/2004 | Miller ......................... 216/94 |
| 2006/0071182 | A1 | * | 4/2006 | Sugiura et al. .......... 250/492.21 |
| 2006/0076511 | A1 | * | 4/2006 | Borden et al. .......... 250/492.21 |
| 2006/0163497 | A1 | * | 7/2006 | Kodama et al. ........ 250/492.21 |

FOREIGN PATENT DOCUMENTS

| JP | 62-229656 | 8/1987 |
| JP | 62-229956 | 10/1987 |
| JP | 02-226079 | 9/1990 |
| JP | 02226079 A * | 9/1990 |
| JP | 05-102305 | 4/1993 |
| JP | 06-112194 | 4/1994 |

OTHER PUBLICATIONS

Smith et al. in "Electrical Characterization of Platinum Deposited by Focuse Ion Beam", IEEE transactions on semiconductor manufacturing vol. 16 No. 2 May 2003.*

* cited by examiner

*Primary Examiner*—Theresa T Doan
*Assistant Examiner*—Sarah K Salerno
(74) *Attorney, Agent, or Firm*—Staas & Halsey LLP

(57) ABSTRACT

A multilayer interconnection structure of the present invention includes first interconnection, second interconnection belonging to an interconnection layer different from an interconnection layer to which the first layer belongs, and third interconnection for connecting the first and second interconnections, the third interconnection belonging to a different interconnection layer and including interconnection along a body diagonal for connecting two points in different planes belong to different interconnection layers. A method for producing the multilayer interconnection structure includes a step of forming the third interconnection, the step including a step of forming a through hole along the body diagonal, and a step of filling the through hole with a conductive material.

3 Claims, 16 Drawing Sheets

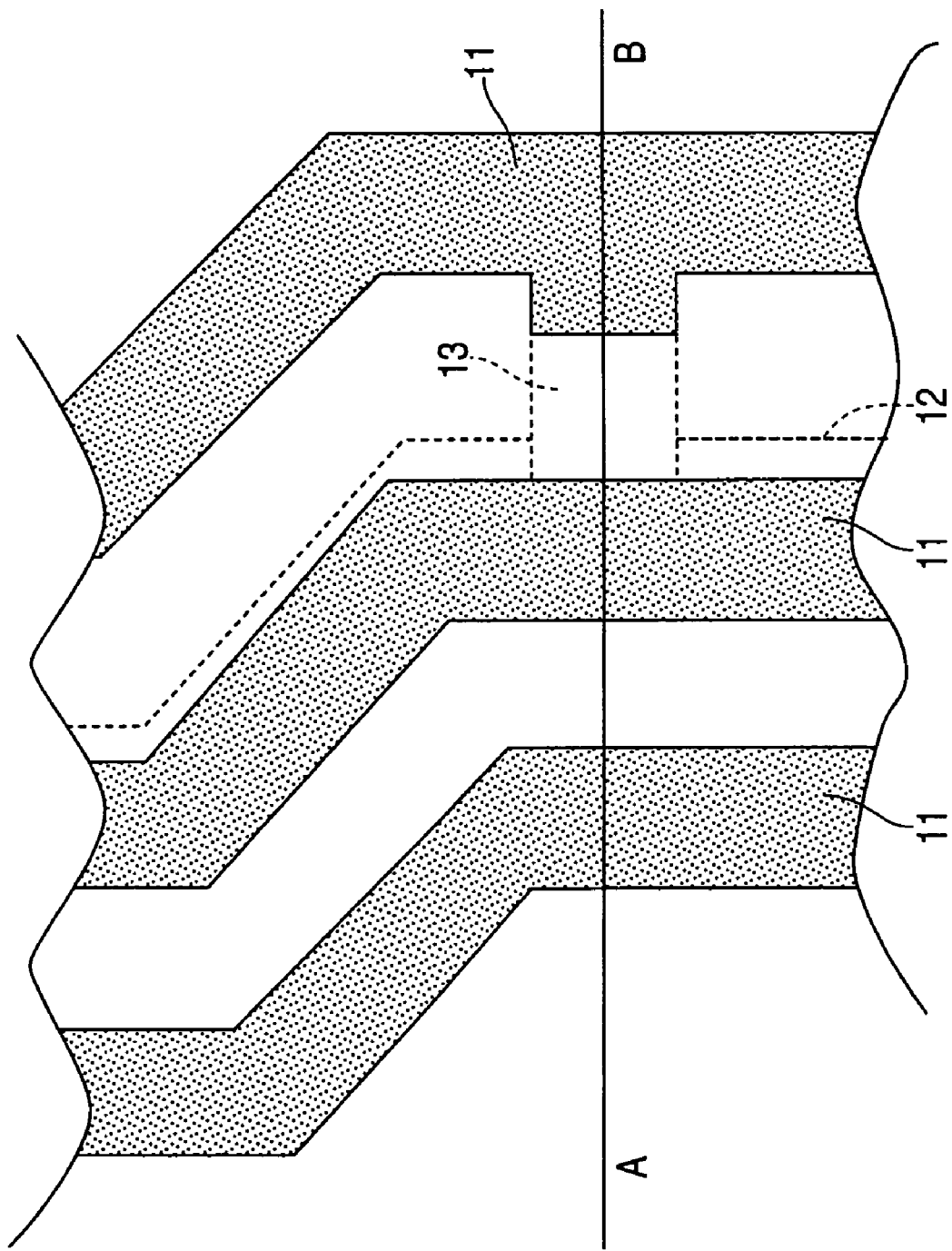

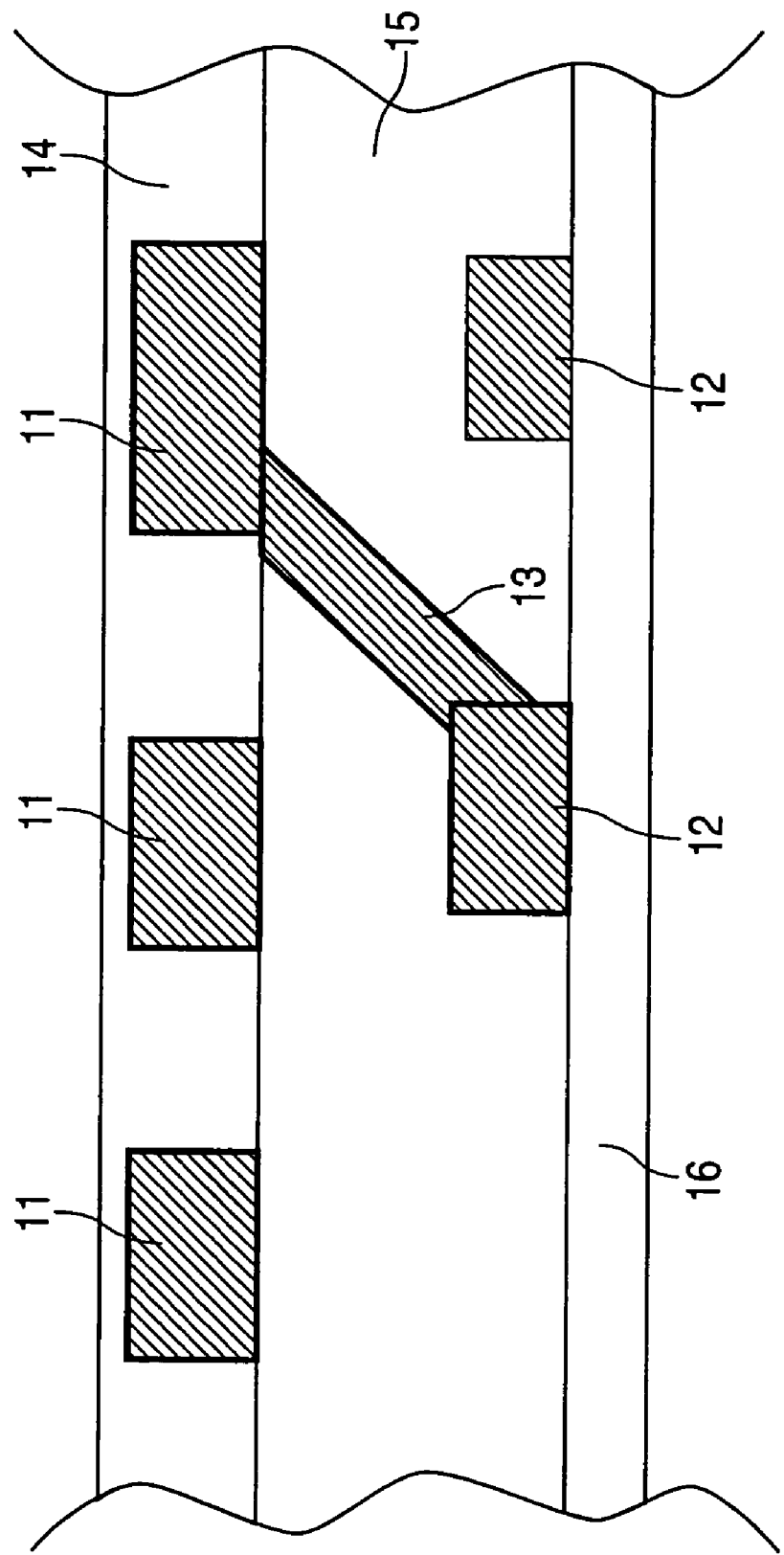

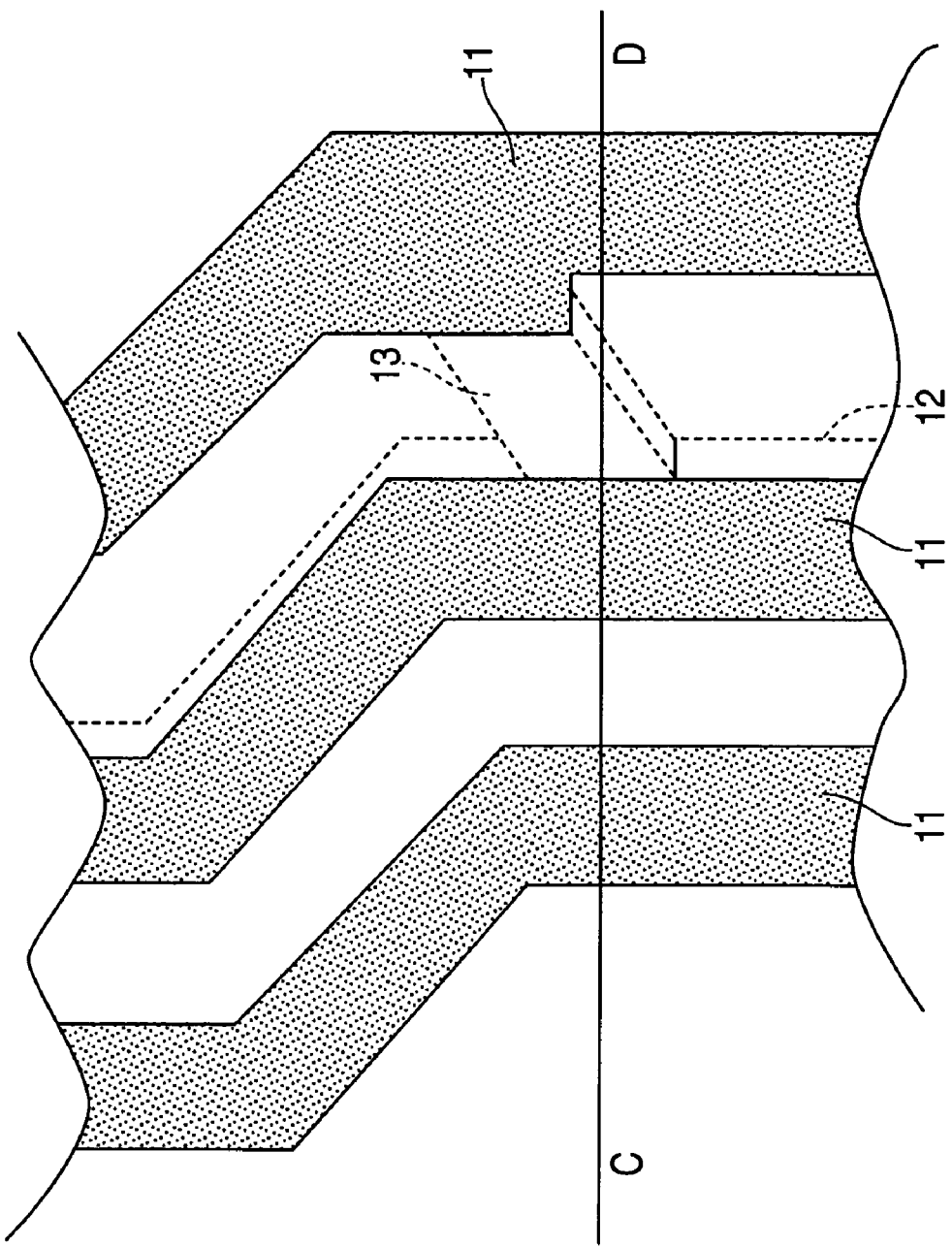

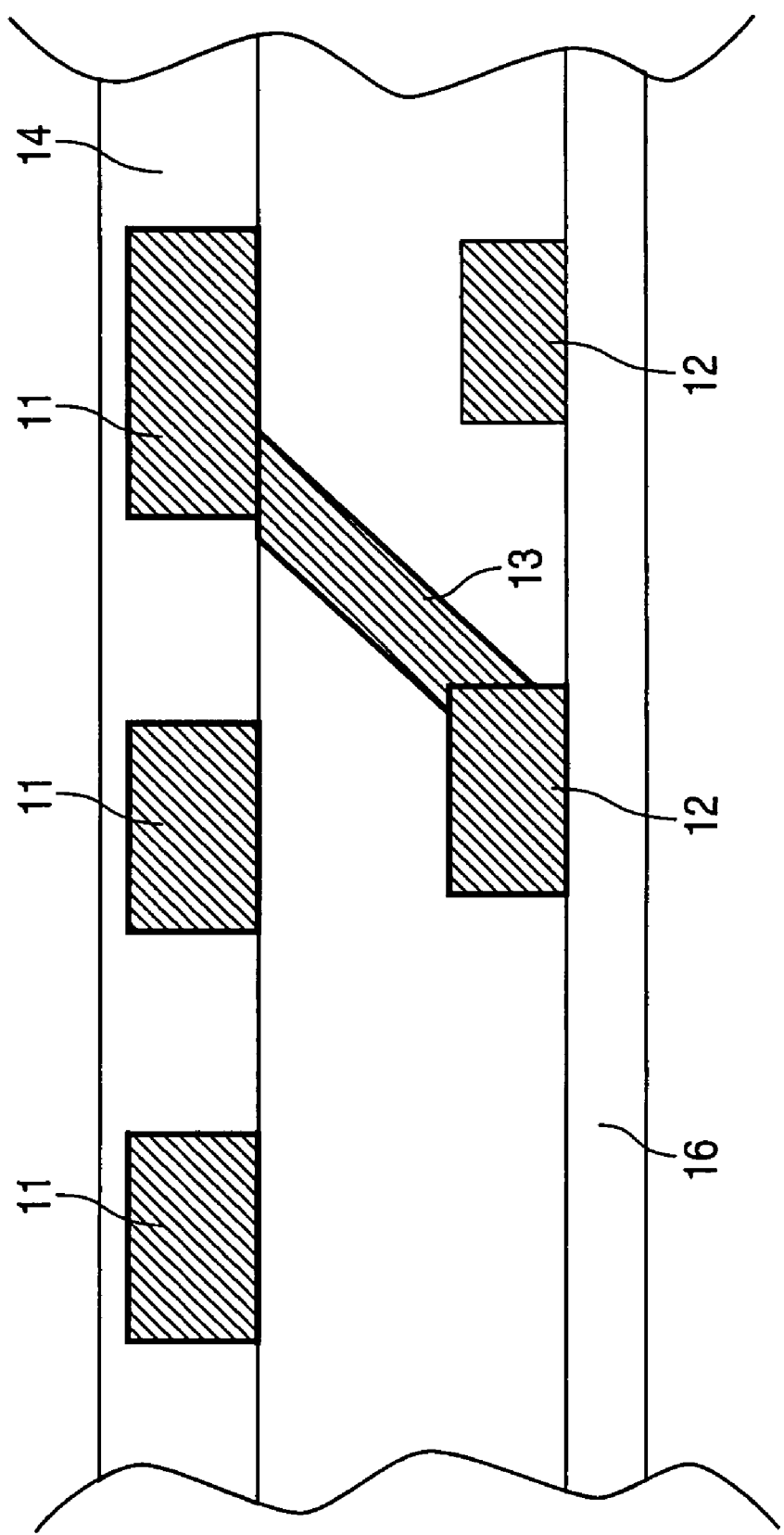

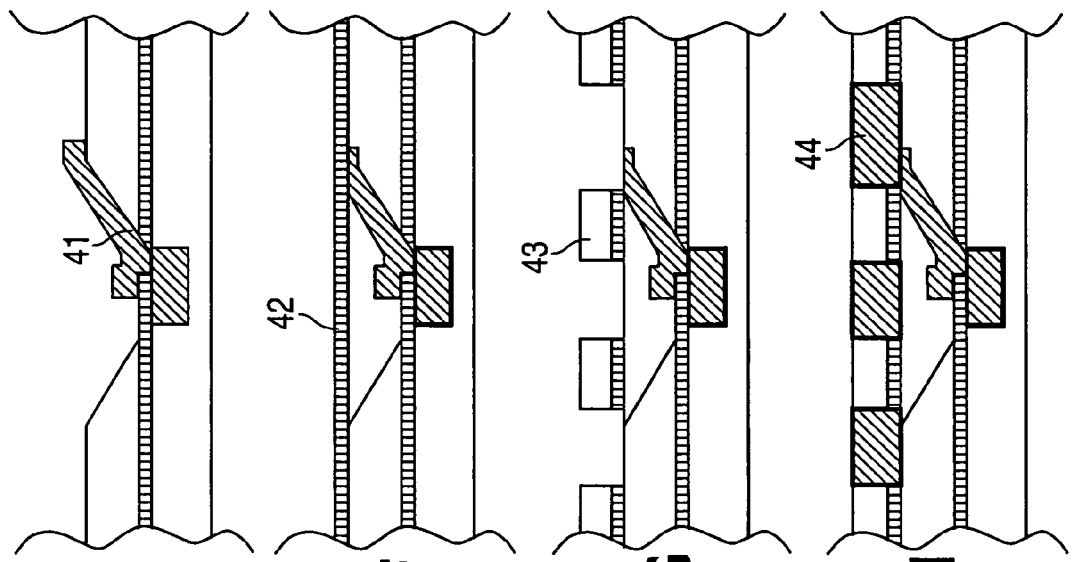
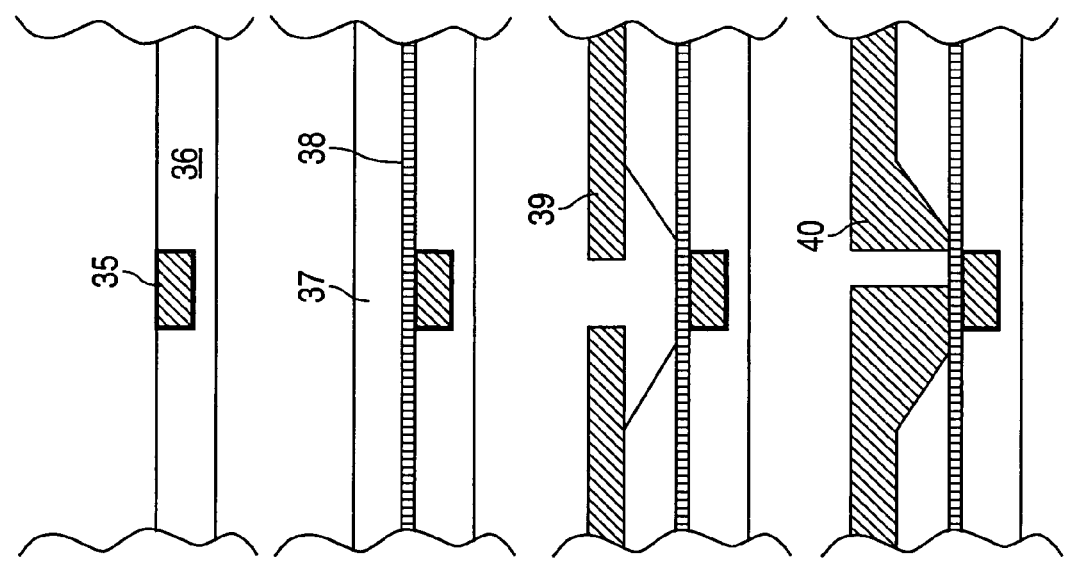

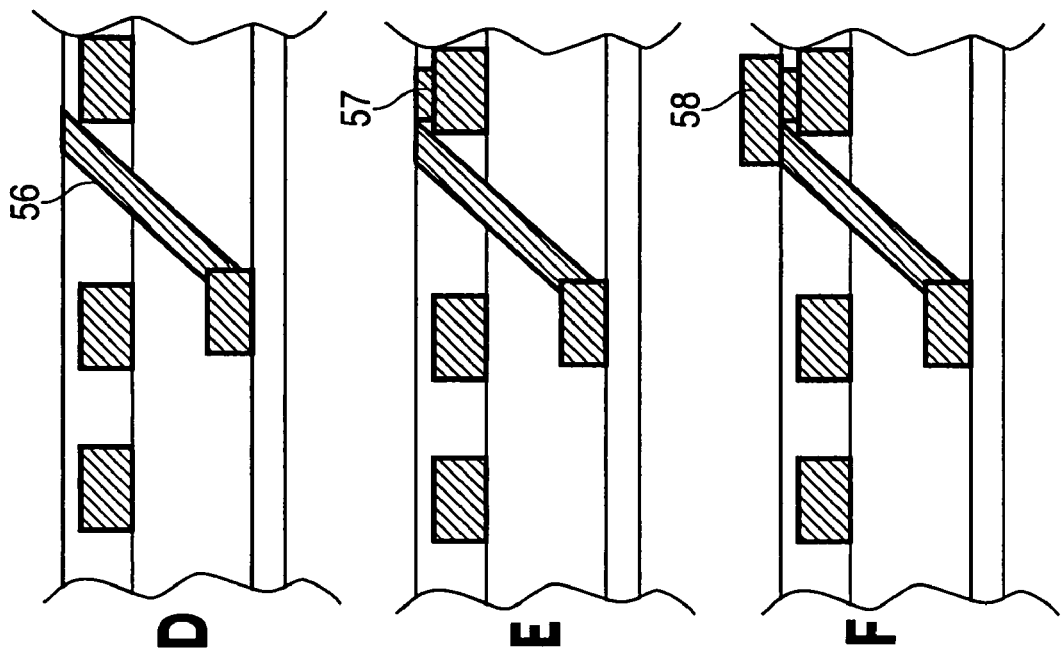
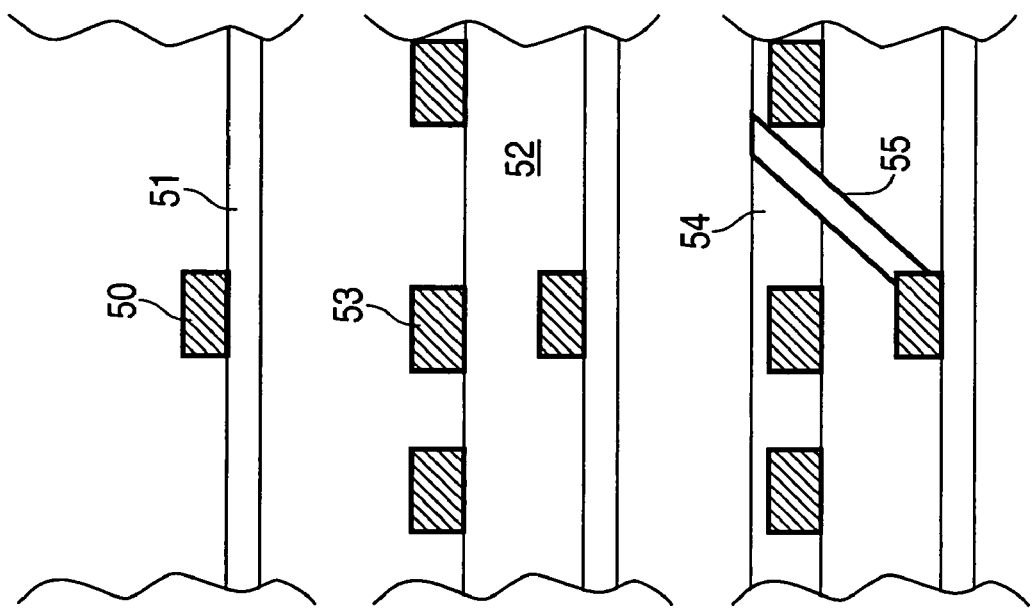

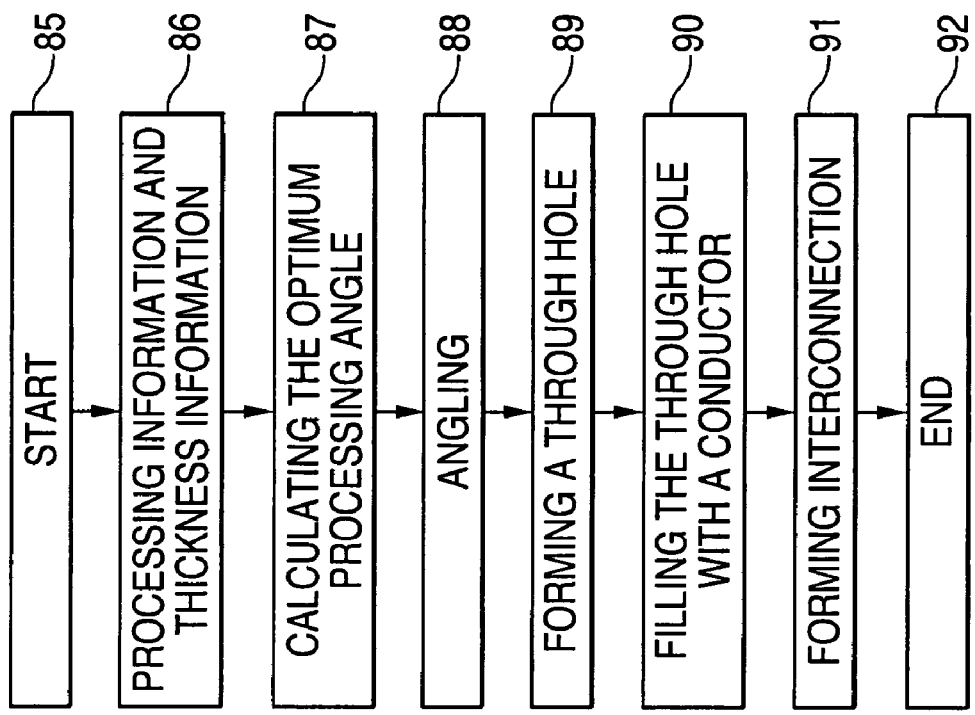

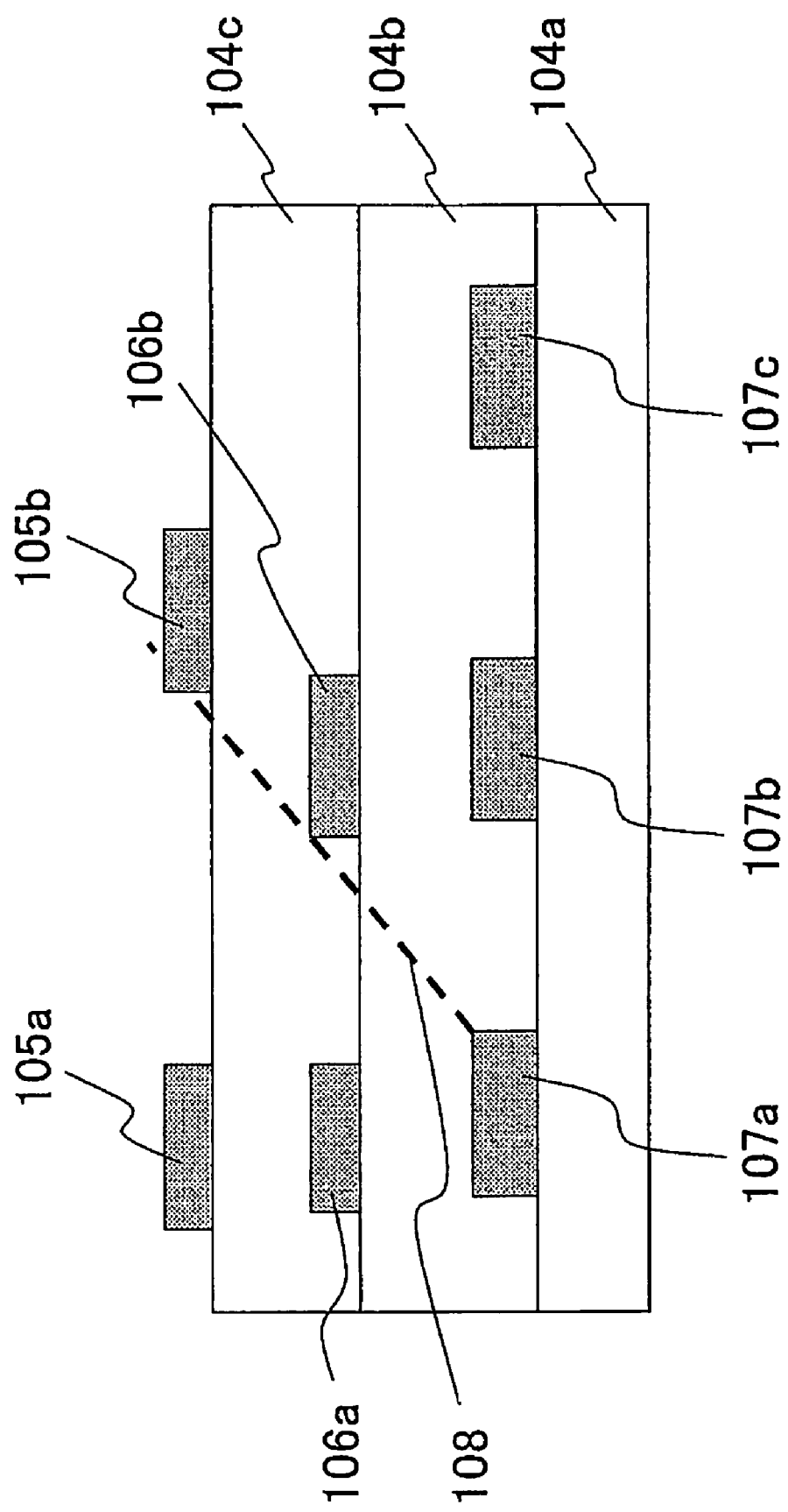

MULTILAYER INTERCONNECTION STRUCTURE AND METHOD FOR FORMING THE SAME

CROSS-REFERENCE TO RELATED APPLICATIONS

This application is based upon and claims the benefit of priority from the prior Japanese Patent Application No. 2004-187005, filed on 2004 Jun. 24, the entire contents of which are incorporated herein by reference.

BACKGROUND OF THE INVENTION

1. Field of the Invention

The present invention relates to a multilayer interconnection structure of a semiconductor device in which different interconnection layers of multilayer interconnection are connected at predetermined positions, and a method for forming the multilayer interconnection structure. In particular, the present invention relates to a multilayer interconnection structure of a semiconductor device, the multilayer interconnection structure including a connecting interconnection for connecting predetermined two points of different interconnection layers of multilayer interconnection structure with a short distance therebetween.

2. Description of the Related Art

In a conventional LSI, multilayer interconnection is formed using an algorithm for lattice interconnection. Also, through holes are formed in a lattice pattern in an interlayer insulating film to extend to lower interconnection perpendicularly to a semiconductor surface so that different interconnection layers of multilayer interconnection are connected with conductive interconnections formed in the through holes.

However, the above-described multilayer interconnection has the limitation that it is formed in a lattice pattern. Therefore, when a predetermined point is connected to a point diagonal to the predetermined point, additional interconnection is required. Namely, when the two points of interconnection layers in the same plane are connected, the required interconnection length is $\sqrt{2}$ times or more as long as the slant distance between two points, while when the two points of different interconnection layers are connected, the required interconnection length is $\sqrt{3}$ times or more. As a result, the interconnection resistance and interconnection capacity are increased to cause a signal delay.

FIG. 16 shows a multilayer interconnection technology as Conventional Example 1 in which increases in interconnection resistance and interconnection capacity are suppressed using a lower interconnection layer with a interconnection distance $\lambda$ in the same plane, which belongs to a first interconnection lattice layer 158 or a second interconnection lattice layer 157, and an upper interconnection layer of diagonal interconnection with a interconnection distance $\sqrt{2}\lambda$ in the same plane, which belongs to a third interconnection lattice layer 155 or a fourth interconnection lattice layer 156 (Japanese Unexamined Patent Application Publication Nos. 5-102305 and 2000-82743). Namely, different interconnections belonging to the first or second interconnection lattice layer are connected using the third or fourth interconnection lattice layer. Also, through holes are formed in an interlayer insulating film in a lattice pattern comprising the intersections of interconnection in the first (or second) interconnection lattice layer and interconnection in the third (or fourth) interconnection lattice layer in such a manner that the through holes extend to interconnection belonging to the first (or second) interconnection lattice layer in the direction perpendicular to a semiconductor surface. Then, interconnection belonging to the first (or second) interconnection lattice layer is connected to interconnection belonging to the third (or fourth) interconnection lattice layer by using the conductive interconnections formed in the through holes. In the configuration of Conventional Example 1, the length of interconnection in a plane for connecting different interconnections belonging to the first interconnection lattice layer using interconnection belonging to the third interconnection lattice layer is $1/\sqrt{2}$ of that using interconnection belonging to the second interconnection lattice layer.

In a technique of Conventional Example 2 proposed as a technique for forming through holes in an interlayer insulating film so that the through holes reach lower interconnection, the through holes are formed using a FIB (focused ion beam) apparatus, for obliquely observing a predetermined point on the lower interconnection from a point in a plane different from the plane of the lower interconnection (Japanese Unexamined Patent Application Publication Nos. 06-112194 and 2-2260790).

In a technique of Conventional Example 3, through holes are formed at two points or more using a FIB apparatus so as to vertically reach lower interconnection, and then interconnection is formed by a laser CVD method, for connecting the two points together (Japanese Unexamined Patent Application Publication No. 62-229956). Namely, connecting interconnection not requiring lattice interconnection is used as interconnection for connecting the two points in the same plane.

The FIB apparatus is used for processing a submicron region by applying an ion beam converged by an electrostatic lens to an object to be processed. The laser CVD method comprises applying FIB (including a laser beam) to a predetermined portion of an object placed in a metal organic compound gas to deposit a metal material only on the FIB-irradiated portion of the object using the metal organic compound gas.

In a conventional multilayer interconnection structure, in order to connect upper interconnection and lower interconnection, an additional lower interconnection extending from an intersection point between the lower interconnection and the upper interconnection is required for connecting the upper interconnection to the lower interconnection. Next, a through hole and conductive interconnection in the through hole are required, the through hole vertically extending from the intersection point between the lower interconnection and the upper interconnection.

Since the additional lower interconnection is required, arrangement of the lower interconnection layer has no degree of freedom, and thus the interconnection density cannot be increased. Furthermore, the connecting interconnection comprising the additional lower interconnection and the conductive interconnection in the through hole does not necessarily take the shortest route for connecting the upper interconnection layer and the lower interconnection layer.

SUMMARY OF THE INVENTION

Accordingly, it is an object of the present invention to provide a multilayer interconnection structure including connecting interconnection for connecting predetermined two points with a short distance therebetween, the two points belong to different interconnection layers of multilayer interconnection, and a method for forming the connecting interconnection in the multilayer interconnection structure.

A multilayer interconnection structure of the present invention comprises a plurality of interconnection layers including at least a first interconnection layer and a second interconnection layer. The multilayer interconnection structure comprises first interconnection extending on the first plane, second interconnection extending on the second plane, and third interconnection for connecting the first and second interconnections, the third interconnection including interconnection along a body diagonal defined by a first point of the first interconnection and a second point of the second interconnection.

Since the third interconnection for connecting interconnections includes the interconnection along the body diagonal, the degree of freedom of arrangement of the third interconnection for connecting interconnections is increased, and the interconnection density in the multilayer interconnection structure is improved. Furthermore, in a portion using the body diagonal, the length of the third interconnection for connecting interconnections can be decreased, thereby decreasing the interconnection resistance and interconnection capacity of the third interconnection for connecting interconnections.

The present invention also provides a method for forming the multilayer interconnection structure, the method comprising a first interconnection forming step of forming the first interconnection, a second interconnection forming step of forming the second interconnection after the first interconnection forming step, and a third interconnection forming step of forming the third interconnection for connecting interconnections after the second interconnection forming step. In order to form interconnection along a body diagonal in the third interconnection for connecting interconnections, preferably, a through hole is formed along the body diagonal and filled with a conductive material.

Since the third interconnection for connecting interconnections can be added after the formation of the first and second interconnections, connection points of the first and second interconnections can be corrected.

The present invention further provides a FIB (fine ion beam) apparatus for easily forming the multilayer interconnection structure, the apparatus comprising a control unit and a processing unit. The processing unit includes a beam irradiation mechanism, and a control mechanism for controlling the angle of a semiconductor substrate. The semiconductor substrate is inclined to make the body diagonal vertical on the basis of a command from the control unit, and then FIB irradiation is performed to form the through hole. Also, on the basis of a command from the control unit, FIB irradiation is performed to fill the through holes with a metal material, and thereby interconnection along the body diagonal is formed.

By using the FIB apparatus, interconnection can be easily formed along the body diagonal.

BRIEF DESCRIPTION OF THE DRAWINGS

FIG. 2 is a plan view of a multilayer interconnection structure according to a first embodiment;

FIG. 3 is a sectional view of the multilayer interconnection structure according to the first embodiment;

FIG. 4 is a plan view of a multilayer interconnection structure according to a modified embodiment of the first embodiment;

FIG. 5 is a sectional view of the multilayer interconnection structure according to the modified embodiment of the first embodiment;

FIG. 7 are sectional views of a multilayer interconnection structure according to a third embodiment;

FIG. 8 are sectional views of a multilayer interconnection structure according to a fourth embodiment;

FIG. 10 is a flow chart showing a method for forming connecting interconnection according to the fifth embodiment;

FIG. 12 is a drawing showing an example of defects in a sixth embodiment;

DESCRIPTION OF THE PREFERRED EMBODIMENTS

A multilayer interconnection structure according to an embodiment has a planar structure comprising a lower interconnection layer, an upper interconnection layer different from the lower interconnection layer, an insulation layer between the lower and upper interconnection layers, and connecting interconnection for connecting the lower and upper interconnection layers.

The connecting interconnection is formed as follows: The lower interconnection layer, the insulation layer, and the upper interconnection layer are formed in that order. Next, a through hole is formed in the insulation layer along a body diagonal which connects a predetermined point of the lower interconnection layer and a predetermined relay point on the insulation layer on which the upper interconnection layer is disposed, the relay point being not coplanar with the predetermined point of the lower interconnection layer. Then, the through hole is filled with a conductive material to form interconnection to the relay point. Thereafter, a conductive material is disposed on the insulation layer to connect the relay point and a predetermined point of the upper interconnection layer together.

The connecting interconnection for the lower and upper interconnection layers may be formed by a method comprising forming the lower interconnection layer and the insulation layer in that order, forming a through hole in the insulation layer along a body diagonal in order to form interconnection between the lower interconnection layer and the relay point, filling the through hole with a conductive material, and then simultaneously forming the upper interconnection layer and interconnection for connecting the relay point and the upper interconnection layer on the insulation layer.

The above-described multilayer interconnection structure includes a body diagonal not requiring a vertical through hole and interconnection within the same interconnection layer, and thus has the effect of increasing the degree of freedom of arrangement of the connecting interconnection for connecting the upper and lower interconnection layers. Also, the multilayer interconnection structure has an improved interconnection density. Furthermore, the connecting interconnection includes a portion in which the interconnection length can be decreased by using the body diagonal.

First Embodiment (Multilayer Interconnection Structure Comprising Lower and Upper Interconnection Layers Connected by Connecting Interconnection Including Interconnection Along a Body Diagonal)

Figure 1:
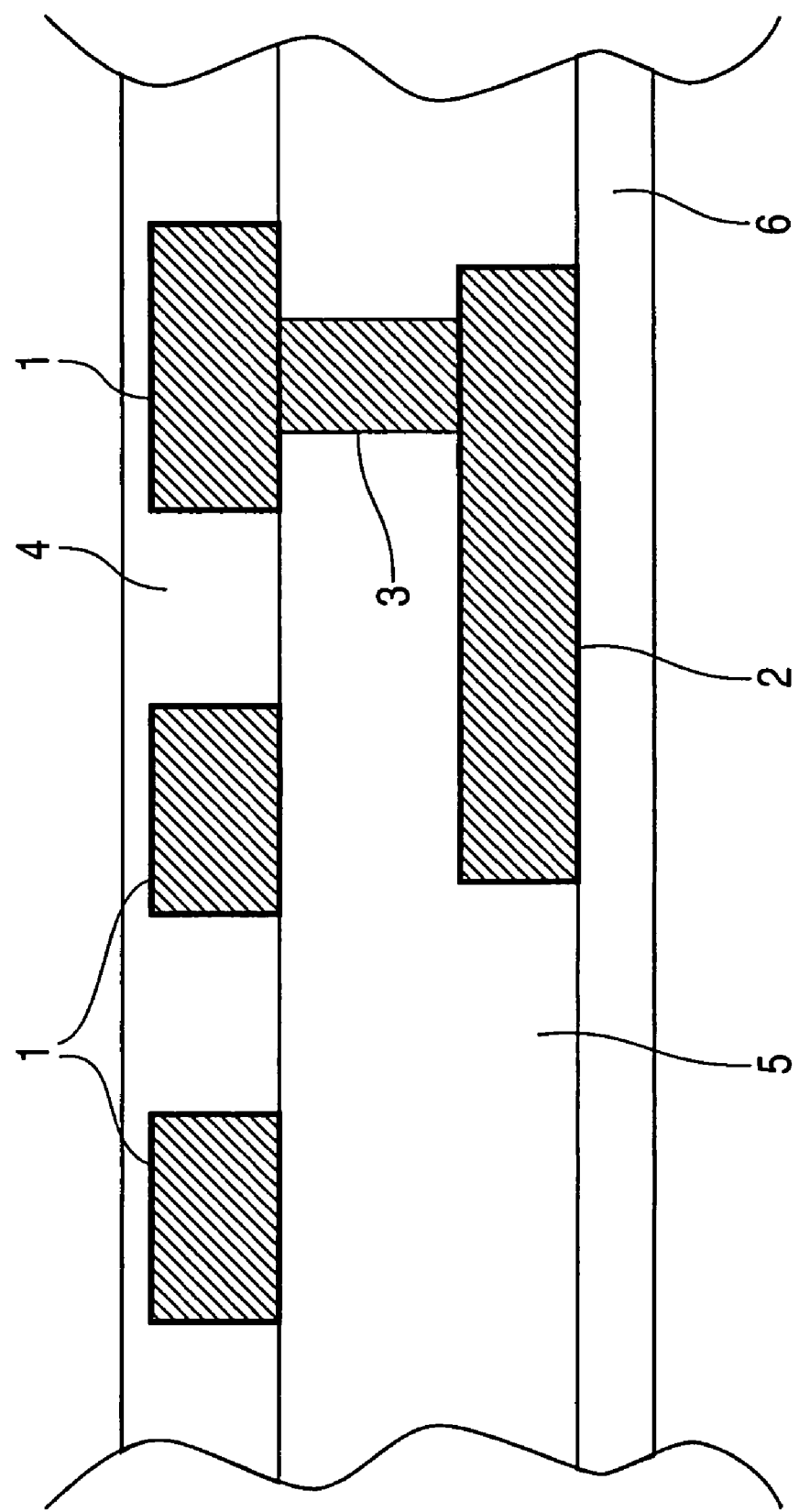
FIG. 1 is a drawing showing a conventional multilayer interconnection structure.

As shown in FIG. 1, a conventional multilayer interconnection structure comprises a lower interconnection layer 2, an upper interconnection layer 1, connecting interconnection 3, interlayer insulation layers 4 and 5, and an insulation layer 6. In the conventional multilayer interconnection structure, the upper and lower interconnection layers 1 and 2 are connected by the following structure. First, it is necessary to provide the connecting interconnection 3 which vertically extends from the upper interconnection layer 1. Next, in order to connect the lower interconnection layer 2 to the connecting interconnection 3 vertically extending from the upper interconnection layer 1, the lower interconnection layer 2 is required to have a line extending to the point of connection with the connecting interconnection 3.

Since the lower interconnection layer 2 is required to have the extending line, arrangement of the lower interconnection layer 2 has no degree of freedom. Also, since the lower interconnection layer 2 is provided with the extending line, the lower interconnection layer 2 cannot be disposed adjacent to another lower interconnection layer 2 with a small space therebetween, thereby failing to increase the interconnection density. Furthermore, the interconnection comprising the extending line and the connecting interconnection 3 is not necessarily shortest interconnection, as compared with interconnection between the connection point of the upper interconnection layer 1 and a point estimated as the connection point of the lower interconnection layer 2 if there is not the limitation imposed on a conventional multilayer interconnection structure.

Therefore, a multilayer interconnection structure according to the first embodiment aimed at shortening a connecting line between the upper and lower interconnection layers 1 and 2 will be described with reference to FIGS. 2 and 3.

FIG. 2 shows the planar configuration of the multilayer interconnection (or wiring) structure according to the first embodiment. In FIG. 2, a spotted pattern with contours shown by solid lines corresponds to an upper interconnection layer 11, and a pattern shown by a dotted line corresponds to a lower interconnection layer 12. Also, a pattern shown by dashed lines corresponds to connecting interconnection 13 for connecting the upper and lower interconnection layers 11 and 12 together.

FIG. 3 shows the sectional configuration of the multilayer interconnection (or wiring) structure according to the first embodiment taken along line A-B in FIG. 2. In FIG. 3, a shadowed pattern with contours shown by solid lines corresponds to the upper interconnection layer 11, the lower interconnection layer 12, and the connecting interconnection 13.

The connection point between the connecting interconnection 13 and the upper interconnection layer 11 is not coplanar with the connection point between the connecting interconnection 13 and the lower interconnection layer 12, but the two connection pints are on the same axis in a plane. The connecting interconnection 13 is disposed along a body diagonal of a rectangular prism including the connection points between the connecting interconnection 13 and the upper and lower interconnection layers 11 and 12 as diagonal points.

The multilayer interconnection (or wiring) structure of the first embodiment is produced by the following manufacturing process:

First, an insulation layer 16 is formed on a semiconductor substrate.

Next, in order to form the lower interconnection layer 12, a lower interconnection layer comprising a metal material is deposited, and the metal material is etched through a photoresist interconnection pattern. Then, the photoresist is removed.

Next, an interlayer insulation layer 15 is deposited.

Then, the connecting interconnection 13 is formed by the process described in detail in the second and third embodiments below.

Next, in order to form the upper interconnection layer 11 on the interlayer insulation layer 15, an upper interconnection layer comprising a metal material is deposited, and the deposited metal film is etched through a photoresist interconnection pattern. Then, the photoresist is removed.

Next, in order to further form an upper interconnection layer, an interlayer insulation layer 14 is deposited.

In the multilayer interconnection (or wiring) structure of the first embodiment, as shown in FIGS. 2 and 3, the connecting interconnection 13 along the body diagonal is used for connecting the upper and lower interconnection layers 11 and 12. Therefore, in the multilayer interconnection (or wiring) structure of the first embodiment, the connection points of the upper interconnection layer 11 and the lower interconnection layer 12 are connected with short interconnection, as compared with a conventional multilayer interconnection structure.

Furthermore, the lower interconnection layer 12 is not required to have the extending line shown in FIG. 1, and thus the space between adjacent lower interconnection layers 12 can be decreased, thereby increasing the interconnection density. Furthermore, the additional extending line is unnecessary for connecting the upper and lower interconnection layers 11 and 12, thereby increasing the degree of freedom.

FIGS. 4 and 5 show a multilayer interconnection (or wiring) structure according to a modified embodiment of the first embodiment.

FIG. 4 shows the planar configuration of the multilayer interconnection (or wiring) structure according to the modified embodiment of the first embodiment. In FIG. 4, a spotted pattern with contours shown by solid lines corresponds to an upper interconnection layer 11, and a pattern shown by a dotted line corresponds to a lower interconnection layer 12. Also, a pattern shown by dashed lines corresponds to connecting interconnection 13 for connecting the upper and lower interconnection layers 11 and 12.

FIG. 5 shows the sectional configuration of the multilayer interconnection (or wiring) structure according to the modified embodiment of the first embodiment taken along line C-D in FIG. 4. In FIG. 5, a shadowed pattern with contours shown by solid lines corresponds to the upper interconnection layer 11, the lower interconnection layer 12, and the connecting interconnection 13. The other components including an insulation layer, etc. are the same as shown in FIG. 3.

As shown in FIG. 4, in the modified embodiment, the connection point between the connecting interconnection 13 and the upper interconnection layer 11 is not coplanar with the connection point between the connecting interconnection 13 and the lower interconnection layer 12, and the two connection pints are not on the same axis in a plane. Thus, the connecting interconnection 13 is disposed along a body diagonal of a rectangular prism including the connection points between the connecting interconnection 13 and the upper and lower interconnection layers 11 and 12 as diagonal points.

Therefore, the multilayer interconnection (or wiring) structure according to the modified embodiment of the first embodiment also has the same effect and operation as those in the multilayer interconnection structure of the first embodiment, and further has the effect of further shortening the connecting interconnection 13. This is because assuming that the side length of the rectangular prism including the connection points between the connecting interconnection 13 and the upper and lower interconnection layers 11 and 12 as diagonal points is 1, the maximum length of the interconnection along the body diagonal is $1/\sqrt{3}$ of the length of 3 of the connecting interconnection 13 along a side of the rectangular prism, i.e., $3/\sqrt{3}=\sqrt{3}$.

In the use of a diagonal in the same plane, assuming that the side length of the rectangular prism is 1, the length of the connecting interconnection 13 is $1+\sqrt{2}$. On the other hand, the length of a body diagonal is $\sqrt{3}$ on the assumption that the side length of a rectangular prism is 1. Therefore, the connecting interconnection 13 of the modified embodiment of the first embodiment has a shortening effect, as compared with the use of a diagonal in the same plane.

There is also the effect of increasing the degree of freedom of arrangement of the lower interconnection layer 12 and the interconnection density.

Second Embodiment (Method 1 for Forming the Multilayer Interconnection Structure of the First Embodiment: Forming the Connecting Interconnection Including Interconnection Along the Body Diagonal After Forming Lower and Upper Interconnection Layers)

In the second embodiment, a first method for forming the multilayer interconnection (or wiring) structure of the first embodiment is described with reference to FIGS. 6A to 6F.

Figure 6A:
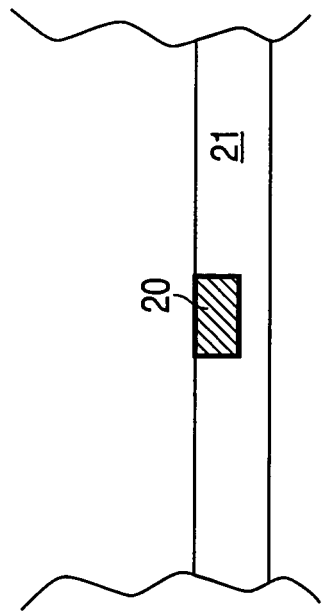
FIG. 6 are sectional views of a multilayer interconnection structure according to a second embodiment.

As shown in FIG. 6A, a step of forming a lower interconnection layer 20 is performed by a so-called damascene process as described below. First, a silicon oxide ($SiO_2$) insulation layer 21 is deposited on a semiconductor substrate. Next, photoresist is coated on the insulation layer 21 and patterned for forming a groove for the lower interconnection layer 20. Next, the silicon oxide ($SiO_2$) insulation layer 21 is etched by reactive ion etching to form the groove for the lower interconnection layer 20, and then the photoresist is removed. Next, a tantalum (Ta) layer is deposited, and then a metal seed layer of copper (Cu) or the like is formed. Then, the groove for the lower interconnection layer 20 is filled with a metal material such as copper (Cu) or the like by plating. Next, the tantalum (Ta) layer and the metal material on the silicon oxide ($SiO_2$) insulation layer 21 are removed by CMP (Chemical Mechanical Polishing).

Figure 6B:
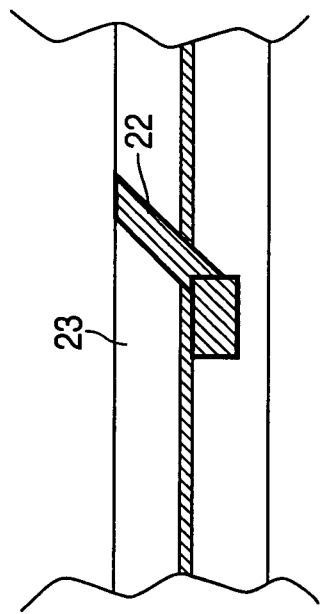

Next, as shown in FIG. 6B, a step of forming an interlayer insulation layer is performed as described below. First, a first silicon nitride (SiN) layer 22 is deposited. The first silicon nitride (SiN) layer 22 also functions to prevent diffusion of the metal material constituting the lower interconnection layer 20. Next, a first silicon oxide ($SiO_2$) layer 23 is deposited.

Figure 6C:
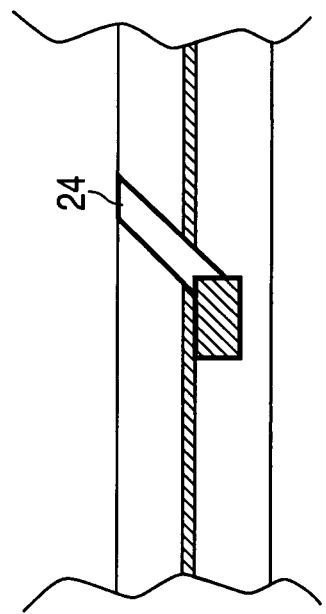

Next, as shown in FIG. 6C, in order to form a through hole 24 in the interlayer insulation layer along a body diagonal, the interlayer insulation layer is irradiated with FIB (focused ion beam) from a direction along the body diagonal. Namely, the through hole 24 is formed by FIB processing. As the FIB, for example, a gallium (Ga) ion beam is used.

Figure 6D:
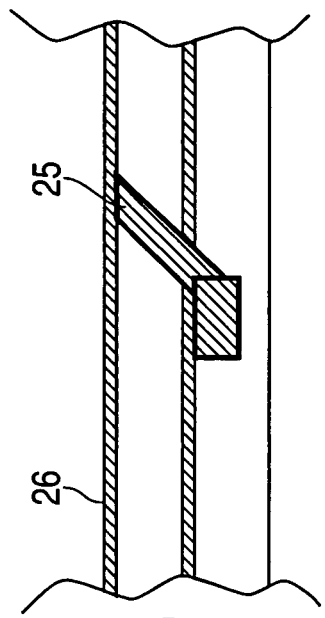

Next, as shown in FIG. 6D, in order to form connecting interconnection 25 by filling the through hole 24 with a metal material, the through hole 24 is filled with a metal material such as tungsten (W) or the like by a so-called laser CVD (chemical vapor deposition) process in which the through hole 24 is irradiated with FIB or the like (including a laser beam) in a metal organic compound gas (for example, tungsten hexacarbonyl ($W(CO)_6$).

Figure 6E:
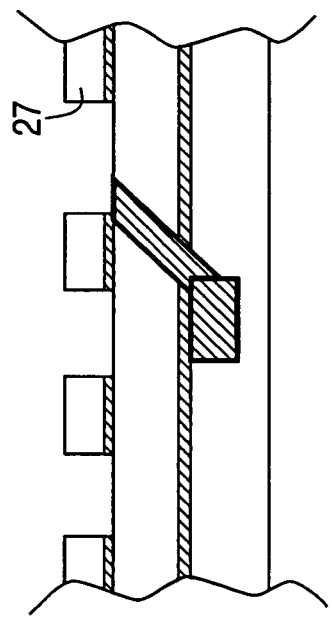

Next, as shown in FIG. 6E, in order to form an upper interconnection layer 29 by a damascene process, the step below is performed. First, a second silicon nitride (SiN) layer 26 is deposited. Next, a second silicon oxide ($SiO_2$) layer 27 is deposited. Then, photoresist is coated on the second silicon oxide ($SiO_2$) layer 27 and patterned for forming a groove of the upper interconnection layer 29. Next, the second silicon oxide ($SiO_2$) layer 27 is etched by reactive ion etching to form the groove for the upper interconnection layer 29. Then, the photoresist is removed, and the second silicon nitride (SiN) layer 26 is etched.

Figure 6F:
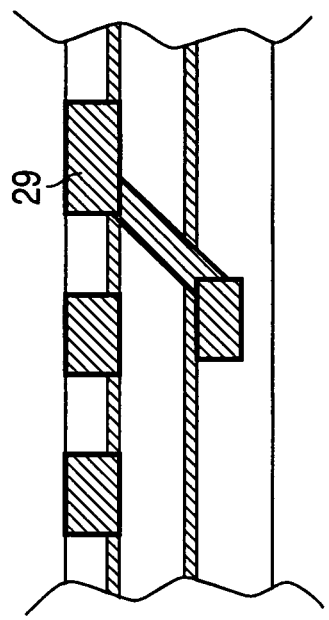

Next, as shown in FIG. 6F, the same step as shown in FIG. 6A is performed for forming the upper interconnection layer 29.

In the multilayer interconnection (or wiring) structure of the second embodiment, the connection points between the connecting interconnection 25 and the upper interconnection layer 29 and between the connecting interconnection 25 and the lower interconnection layer 20 are connected with short interconnection. Also, an extending line from the lower interconnection layer 20 is not necessary for connecting the lower interconnection layer 20 and the upper interconnection layer 29, thereby decreasing the distance between adjacent lower interconnection layers 20 and increasing the interconnection density. Furthermore, the additional extending line is not required for connecting the lower interconnection layer 20 and the upper interconnection layer 29, thereby increasing the degree of freedom.

The process for forming the multilayer interconnection (or wiring) structure of the second embodiment does not require pattering for forming the through hole using photoresist, and thus has the effect of reducing the number of the steps. Also, the process for forming the multilayer interconnection (or wiring) structure of the second embodiment includes substantially he same step as the damascene process in which a vertical through hole is formed and then filled with a conductive material to realize vertical interconnection for connecting upper and lower interconnection layers. Therefore, the process of the second embodiment has consistency with the damascene process and can be easily carried out.

Third Embodiment (Method 2 for Forming the Multilayer Interconnection Structure of the First Embodiment: Forming the Connecting Interconnection Including Interconnection Along the Body Diagonal After Forming the Lower and Upper Interconnection Layers)

In a third embodiment, a second method for forming the multilayer interconnection (or wiring) structure of the first embodiment is described with reference to FIGS. 7A to 7H.

First, in order to form a lower interconnection layer 35 by a so-called damascene process as shown in FIG. 7A, an insulation layer 36 is deposited on a semiconductor substrate. Then, the lower interconnection layer 35 is formed by the same step as shown in FIG. 6A.

Next, as shown in FIG. 7B, in order to form an interlayer insulation layer, a first silicon nitride (SiN) layer 38 and a first silicon oxide (SiO$_2$) layer 37 are deposited in that order.

Next, as shown in FIG. 7C, in order to form inclined surfaces in the first silicon oxide (SiO$_2$) layer 37, the process below is performed. First, photoresist is coated, and an aperture pattern is formed at a connection point between the lower interconnection layer 35 and connecting interconnection 41. Next, the inclined surfaces are formed around the aperture by isotropic etching (for example, wet etching with a diluted hydrogen fluoride solution), and then the photoresist is removed.

Next, as shown in FIG. 7D, in order to form a connection point between the connecting interconnection 41 and the lower interconnection layer 35 by etching the first silicon nitride (SiN) layer 38 on the lower interconnection layer 35, the process below is performed. First, photoresist is coated, and an aperture pattern corresponding to the connection point is formed. Then, the first silicon nitride (SiN) layer 38 is removed by reactive ion etching, and the photoresist is removed.

Next, as shown in FIG. 7E, the process below is performed for forming the connecting interconnection 41. First, a metal interconnection layer is formed. Next, photoresist is coated, and a pattern corresponding to the connecting interconnection 41 is formed. Next, the metal interconnection layer is etched by reactive ion etching. Then, the photoresist is removed.

Next, as shown in FIG. 7F, the process below is performed for planarizing the inclined surfaces formed in the interlayer insulation layer. First, an insulation layer is deposited to fill the inclined portion with the insulation layer. Next, planarization is performed by CMP, and then a second silicon nitride (SiN) layer 42 is deposited.

Next, as shown in FIGS. 7G and 7H, in order to form an upper interconnection layer 44 by a damascene process, a second silicon oxide (SiO$_2$) layer 43 is deposited, and then the upper interconnection layer 44 is formed by the same step as that for forming the lower interconnection layer 35.

In the multilayer interconnection (or wiring) structure of the third embodiment, the connection points between the connecting interconnection 41 and the upper interconnection layer 44 and between the connecting interconnection 41 and the lower interconnection layer 35 are connected with short interconnection. Also, an extending line from the lower interconnection layer 35 is not necessary for connecting the lower interconnection layer 35 and the upper interconnection layer 44, thereby decreasing the distance between adjacent lower interconnection layers 35 and increasing the interconnection density. Furthermore, the additional extending line is not required for connecting the lower interconnection layer 35 and the upper interconnection layer 44, thereby increasing the degree of freedom.

The process for forming the multilayer interconnection (or wiring) structure of the third embodiment has the effect of eliminating the need for a special apparatus for forming connecting interconnection using photoresist.

Fourth Embodiment (Method 3 for Forming the Multilayer Interconnection Structure of the First Embodiment: Forming Connecting Interconnection Including Interconnection Along the Body Diagonal After Forming the Lower and Upper Interconnection Layers)

In the fourth embodiment, a third method for forming the multilayer interconnection (or wiring) structure of the first embodiment is described with reference to FIGS. 8A to 8F.

First, in order to form a lower interconnection layer 50 as shown in FIG. 8A, a first insulation layer 51 is formed on a semiconductor substrate. Next, a metal interconnection layer is deposited by sputtering or CVD. Next, photoresist is coated and an interconnection pattern for the lower interconnection layer 50 is formed. Next, the metal interconnection layer is etched by reactive ion etching to form the lower interconnection layer 50.

Next, in order to form an upper interconnection layer 53 as shown in FIG. 8B, a second insulation layer 52 is deposited. Next, the upper interconnection layer 53 is formed by the same step as shown in FIG. 8A.

Next, as shown in FIG. 8C, a third insulation layer 54 is deposited, and a through hole 55 is formed by the same FIB irradiation as shown in FIG. 6C so that the through hole 55 passes through the second and third insulation layers 52 and 54 along a body diagonal.

Next, as shown in FIG. 8D, the through hole 55 is filled with a metal material to form connecting interconnection 56 along the body diagonal by the same step as shown in FIG. 6D.

Next, as shown in FIG. 8E, a through hole is formed by FIB irradiation so as to reach a connection point on the upper interconnection layer 53 and pass through the third insulation layer 54. Then, the through hole is filled with a metal material by laser CVD to form vertical interconnection 57.

Next, as shown in FIG. 8F, a metal material is deposited by laser CVD to form horizontal interconnection 58 for connecting the connecting interconnection 56 along the body diagonal and the vertical interconnection 57.

The multilayer interconnection (or wiring) structure of the fourth embodiment exhibits the same effect as that of the multilayer interconnection (or wiring) structures of the second and third embodiments. However, the connecting interconnection comprising the connecting interconnection 56 along the body diagonal, the vertical interconnection 57, and the horizontal interconnection 58 can be formed after the upper interconnection layer 58 and the lower interconnection layer 50 are formed. Therefore, there is the effect of further increasing the degree of freedom of the connecting interconnection.

The process for forming the multilayer interconnection (or wiring) structure of the fourth embodiment has the effect that it can be used for correcting a connection point because connecting interconnection can be added after the multilayer interconnection structure is formed.

Fifth Embodiment (Method for Forming Connecting Interconnection Along a Body Diagonal Using FIB Apparatus)

In the fifth embodiment, a method for forming connecting interconnection along a body diagonal by the FIB apparatus is described with reference to FIGS. 9, 10, and 11A to 11D.

Figure 9:
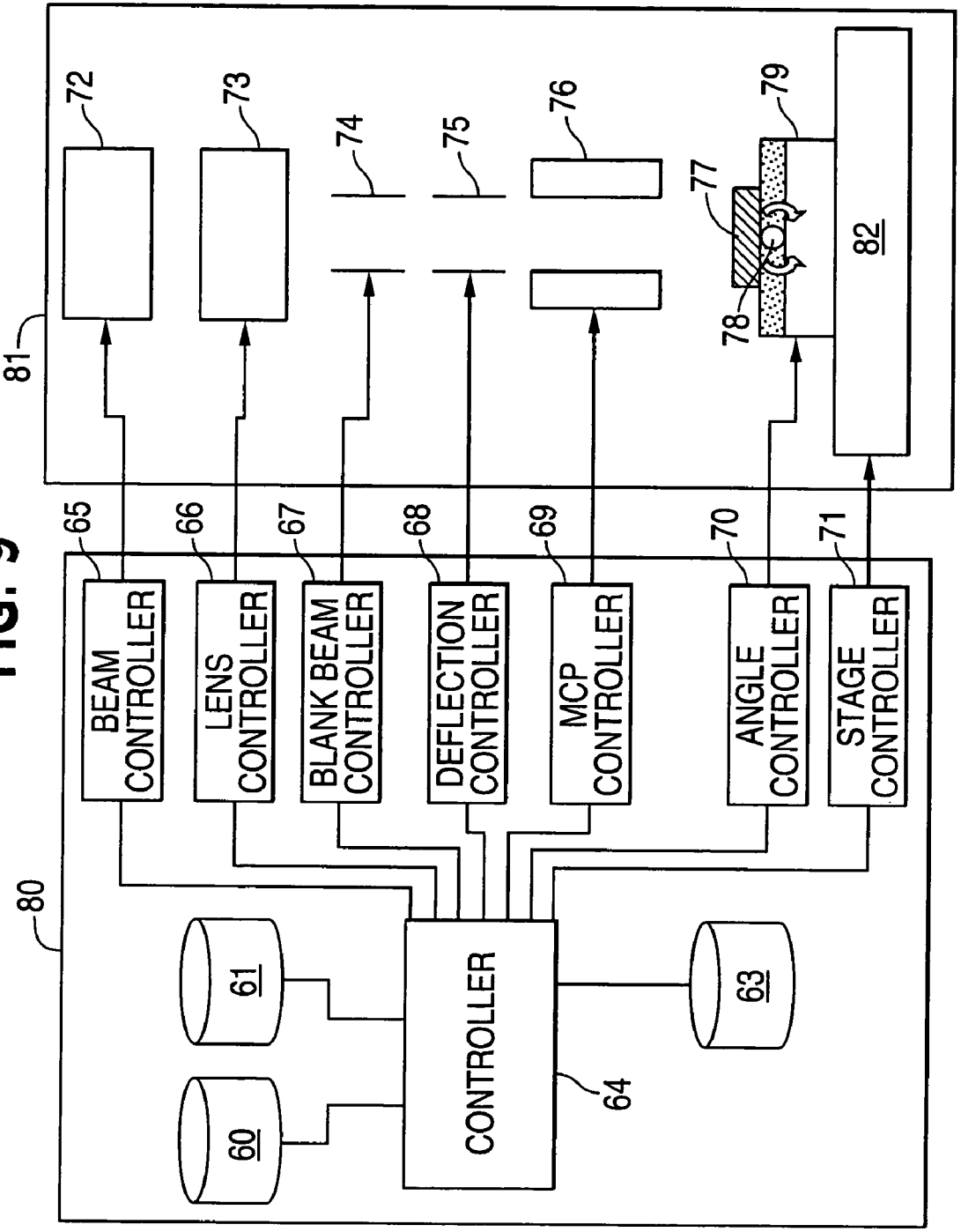
FIG. 9 is a drawing showing the configuration of a FIB apparatus according to a fifth embodiment.

FIG. 9 shows the FIB apparatus used for forming the connecting interconnection along the body diagonal according to this embodiment. The FIB apparatus comprises a control unit 80 and a processing unit 81. The control unit 80 comprises a controller 64, a beam controller 65, a lens controller 66, a beam blank controller 67, a deflection controller 68, a MCP (micro channel plate) controller 69, an angle controller 70, a stage controller 71, a CVD (computer aided design) data storage device 60, a control program storage device 61, and a set value storage device 63. The processing unit 81 comprises a beam irradiation portion 72, a lens portion 73, a beam blank portion 74, a deflection portion 75, a MCP portion 76, an angle control portion 78, a stage portion 79, and a stage bed 82.

The controller 64 contains CPU (central processing unit) and the like. Also, the controller 64 obtains CAD data from the CAD data storage device 60 and a set value from the set value storage device 63 according to the control program supplied from the control program storage device 61 to perform computation and decision. The controller 64 further generates a command signal.

According to the command signal from the controller 64, the beam controller 65 drives the beam irradiation portion 72; the lens controller 66, the lens portion 73; the beam blank controller 67, the beam blank portion 74; the deflection controller 68, the deflection portion 75; the MCP controller, the MCP portion 76; the angle controller 70, the angle control portion 78 to angle an object 77 to be processed; and the stage controller 71, the stage portion 79 on the stage bed 82.

The beam irradiation portion 72 comprises, for example, a beam source (for example, gallium (Ga)), a motion plate for supporting and positioning a filament for liquefying the beam source, a suppressor for controlling a beam current, an extractor for extracting the beam, and an aperture for controlling the beam diameter. The beam irradiation portion 72 has the function to apply the ion beam of gallium (Ga).

The lens portion 73 comprises, for example, a first lens for converging the ion beam from the beam irradiation portion 72 by the generated electromagnetic field, and second and third lenses having the same function as the first lens. Namely, the lens portion 73 has the function as an electrostatic lens.

The beam blank portion 74 comprises, for example, a blanking plate for deflecting the ion beam by an electrostatic field, and a blanking aperture for passing only the ion beam in a predetermined direction. The beam blank portion 74 has the function to effectively separating the ion beam from a processing work.

The deflection portion 75 comprises, for example, an eight-electrode deflector, and has the function to slightly deflect the ion beam and shape the ion beam by the electrostatic field generated by the eight-electrode deflector.

The MCP portion 76 comprises, for example, MCP for detecting secondary electrons or secondary ions, and has the function to detect secondary electrons or secondary ions for obtaining an image of the object processed.

The angle control portion 78 comprises, for example, a plate-shaped base on which the object to be processed is mounted, a supporting shaft for rotatably supporting the plate-shaped base, and a servomotor for controlling the rotational angle of the supporting shaft. Thus, the angle control portion 78 has the function to control vertical rotation of the object to be processed mounted on the base, i.e., inclination of the object, and horizontal rotation thereof. The term "rotation" includes horizontal rotation of only the plate-shaped base on which the object to be process is mounted around the axis of the supporting shaft, and rotation of the object and the plate-shaped base around the axis of the supporting shaft.

When it is supposed that horizontal or vertical rotation of the object to be processed deviates the position or focal point of the ion beam from the object to be processed, the ion beam is finely controlled by the lens portion 73 and the deflection portion 75 according to the command signal from the controller 64, for preventing deviation of the position or the focal point.

The stage portion 79 comprises, for example, a servomotor for moving, along the longitudinal axis or transverse axis, the stage on which the angle control portion 78 is mounted, and a movable portion for horizontally moving the state. The stage portion 79 has the function to control the stage position in conformity with the ion beam.

The stage bed 82 has the function as a base for mounting the stage 79 thereon, and the contact surface between the stage portion 79 and the stage bed 82 functions to smoothly move the stage portion 79.

FIG. 10 is a flow chart showing the method for forming the connecting interconnection along the body diagonal using the FIB apparatus of this embodiment. The method for forming the connecting interconnection along the body diagonal using the FIB apparatus of this embodiment will be described below with reference to FIG. 10.

At the start 85 in the flow chart, an object 77 to be processed has been formed by an ordinary semiconductor manufacturing process. Namely, the object 77 to be processed is formed by an ordinary apparatus for manufacturing a semiconductor device (for example, an insulation layer depositing apparatus such as a CVD apparatus, a photoresist coating apparatus, an exposure device, an apparatus for depositing metal interconnection layers or the like, etc.). For example, the object 77 to be processed is formed as described below. First, an insulation layer, a lower interconnection layer, an interlayer insulation layer, an intermediate interconnection layer, and an interlayer insulation layer are deposited on a semiconductor substrate in that order.

Next, as shown in the flow chart, the object 77 to be processed is placed in the FIB apparatus, and processing information and thickness information 86 of the object 77 are obtained from the set value storage device. The processing information and thickness information include, for example, the thickness of an insulation layer between upper and lower interconnection layers of the object 77, the positions of two points defining the body diagonal, etc.

Next, in the step 87 of calculating the optimum processing angle in the flow chart, the solid angle formed by the body diagonal and the direction of FIB irradiation is calculated from the positions of the two points, for forming a through hole in the insulation layer along the body diagonal.

Figure 11C:
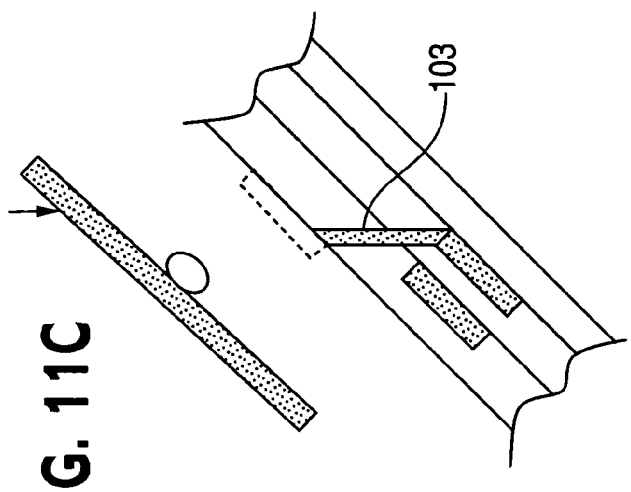
FIG. 11 are drawings showing a principal portion of the method for forming the connecting interconnection according to the fifth embodiment.
Figure 11D:
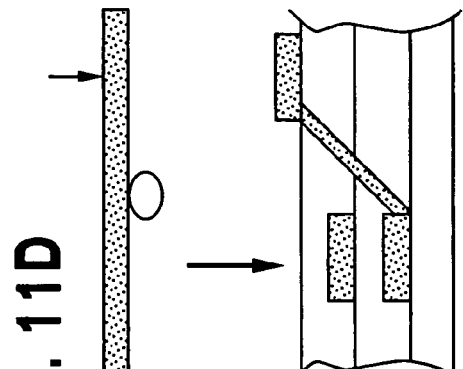
Figure 11A:
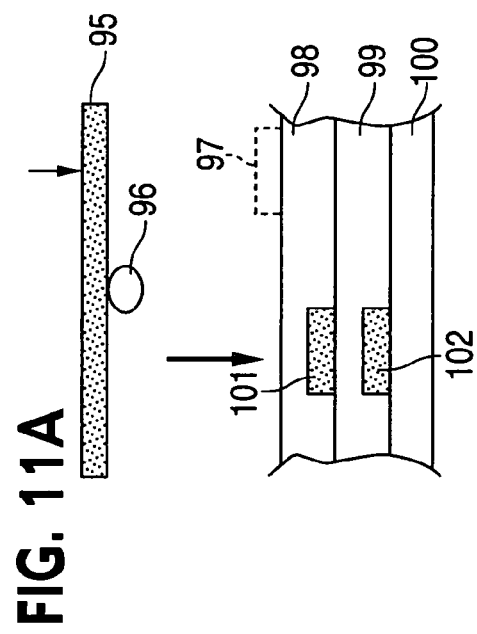

Next, in the angling step 88 in the flow chart, the object 77 to be process is angled on the basis of the solid angle calculated in the above-described step. This step is described in further detail below with reference to FIGS. 11A and 11B. In FIG. 11A, an upper drawing is a schematic drawing showing only the entirety of an object 95 to be processed and a rotational shaft 96 for supporting the bed of the angle control portion, for illustrating the step of angling the object 95 to be processed. In the upper drawing, a processed portion 96 of the object 95 is shown by a small circle. A lower drawing of FIG. 11A is a sectional drawing of the processed portion 96 of the object 95. The lower drawing shows the object 95 in a horizontal state in which an insulation layer 100, a lower interconnection layer 102, a first interlayer insulation layer 99, an intermediate interconnection layer 101, and a second interlayer insulation layer 98 are disposed on a semiconductor substrate in that order. In this state, the intermediate interconnection layer 101 and the lower interconnection layer 102 overlap each other as seen from the direction of FIB irradiation shown by a thick arrow in FIG. 11. Furthermore, in the lower drawing, a rectangular shown by a dotted line indicates an upper interconnection layer 97 to be disposed on the insulation layer 98.

Figure 11B:
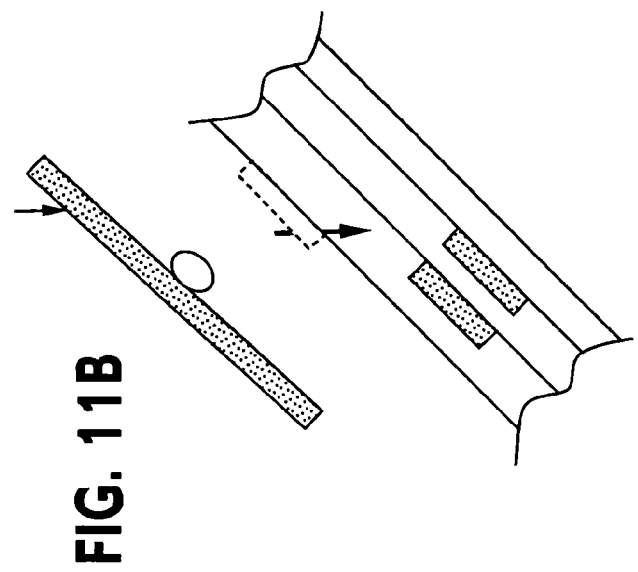

In FIG. 11B, an upper drawing is the same schematic drawing as in FIG. 11A except that the object 95 to be processed is angled. Therefore, the portion shown by a small circle is angled so that the body diagonal coincides with the FIB irradiation direction, as shown in the lower drawing of FIG. 11B.

The body diagonal is determined according to the predetermined portions of the lower and upper interconnection layers.

Returning to the flow chart of FIG. 10, in the step 89 of forming a through hole reaching the lower interconnection layer after completion of the angling step 88, the through hole is formed by FIB irradiation so as to reach the lower interconnection layer along the body diagonal.

Next, in the step 90 of filling the through hole with a conductor in the flow chart, the through hole is filled with a conductor such as a metal material or the like. In this step, the through hole of the object to be processed is irradiated with FIB (including a laser beam) in a metal organic compound (for example, tungsten hexacarbonyl ($W(CO)_6$) to fill the through hole with a metal material such as tungsten (W) or the like.

The step 89 of forming a through hole reaching the lower interconnection layer and the step 90 of filling the through hole with the conductor will be described in detail below with reference to FIGS. 11C and 11D. The upper and lower drawings of FIG. 11C correspond to the upper and lower drawings, respectively, of FIG. 11B. However, unlike the lower drawing of FIG. 11B, the lower drawing of FIG. 11C shows a state after the step described below. After the angling step of aligning the direction of FIB with the direction of the body diagonal, a processed portion of the object 95 to be processed is irradiated with FIB to selectively cut the insulation layer between the interconnection layers and form the through hole. After the through hole is formed, the through hole is filled with the conductor such as a metal material or the like to form connecting interconnection 103 for connecting the lower and upper interconnection layers. Next, as shown in FIG. 11D, the object 95 is returned to a horizontal state.

Returning to the flow chart of FIG. 10, in the step 91 of forming interconnection after the step 90 of filling the through hole with the conductor, the object 95 to be processed is transferred into a general semiconductor manufacturing apparatus in which the upper interconnection layer is formed at a predetermined position on the interlayer insulation layer. As a result, a multilayer interconnection structure comprising the upper and lower interconnection layers connected by the connecting interconnection along the body diagonal is completed to finish the process at the end 92.

The method for forming the connecting interconnection along the body diagonal by the FIB apparatus according to the fifth embodiment has the effect that the object to be processes can be oriented in the FIB irradiation direction and the body diagonal direction by the angle control portion, which is a small mechanism, in the FIB apparatus, in order to form the connecting interconnection along the body diagonal. The reason for using the small-sized angle control portion is that a mechanism for orienting the FIB irradiation unit in the body diagonal direction without moving the object to be processed requires a mechanism for driving the FIB irradiation portion, thereby increasing the size of the FIB apparatus.

The angle control portion is linked to the controller of the FIB apparatus, thereby facilitating rotation and angling of the object to be processed. There is thus the effect of facilitating formation of the through hole along any desired body diagonal and conductor filling of the through hole.

Sixth Embodiment (FIB Apparatus Suitable for Forming Interconnection Along the Body Diagonal Without Damaging Other Interconnections)

In order to connect the upper and lower interconnection layers with connecting interconnection along the body diagonal, the FIB apparatus used in the fifth embodiment can be used. However, when the connecting interconnection is simply determined along the body diagonal in consideration of only the predetermined points of the upper and lower interconnection layers, interconnections other than the target interconnection to be connected may be damaged during processing. Therefore, a FIB apparatus capable of preventing damage to the other interconnections is required.

First, the possibility of damage to the other interconnections is described, and this embodiment is described as a countermeasure against the damage.

In a multilayer interconnection (or wiring) structure comprising lower interconnection layers 107a to 107c, intermediate interconnection layers 106a and 106b, upper interconnection layers 105a and 105b, and interlayer insulating layers 104a to 104c shown in FIG. 12, when connecting interconnection for connecting a connection target point of the lower interconnection layer 107a and a connection target point of the upper interconnection layer 105b is desired to be formed along a dotted line 108, another interconnection 106b is present between the two connection target points. Thus, the other interconnection 106b may be damaged by the FIB with radius S applied at an angle of 45 degrees with respect to the connection target point of the lower interconnection layer 107a. Therefore, a through hole cannot be formed along the dotted line 108 connecting the connection target points of the lower interconnection layer 107a and the upper interconnection layer 105b, thereby failing to form the connecting interconnection.

Figure 13:
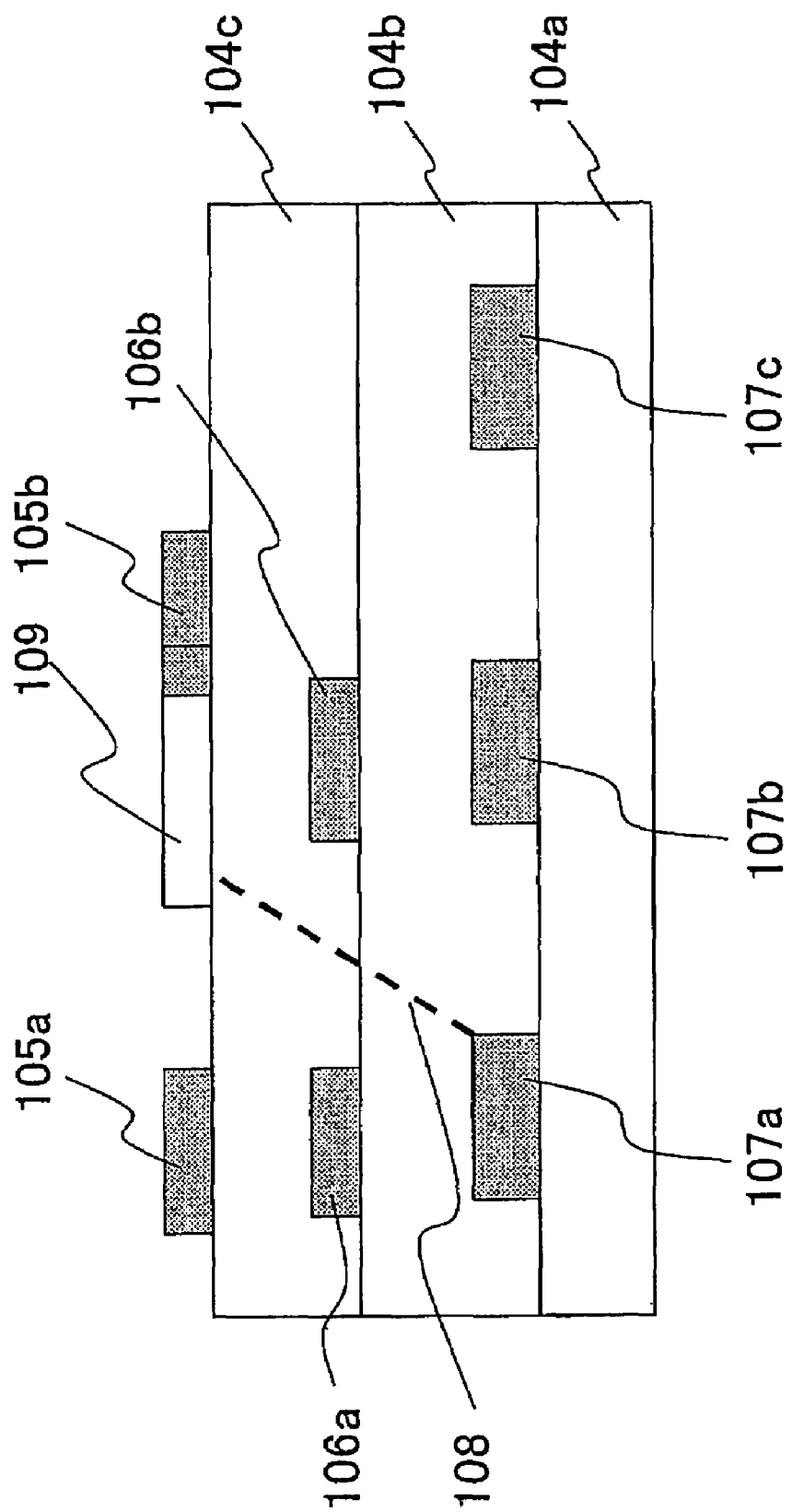
FIG. 13 is a drawing showing an example of formation of connecting interconnection according to the sixth embodiment.

Therefore, in the same multilayer interconnection structure as shown in FIG. 12, the direction or angle of FIB irradiation with respect to the connection target point of the lower interconnection layer 107a is changed to determine a relay point 109 on the interlayer insulating layer 104c on which the upper interconnection layer 105b is formed, so that FIB is applied along a body diagonal 108 connecting the connection point of the lower interconnection layer 107a and the relay point 109 while avoiding the other interconnection, as shown in FIG. 13. Next, a through hole connecting the relay point 109 and the connection point of the lower interconnection layer 107a is formed by FIB irradiation. Then, a conductive material is filled in the through hole connecting the relay point 109 and the connection point of the lower interconnection layer 107a to form interconnection. Furthermore, interconnection is formed for connecting the relay point 109 and the connection point of the upper interconnection layer 105b to form connecting interconnection for connecting the lower and upper interconnection layers 107a and 105b. As a result, the connection target points of the lower and upper interconnection layers 107a and 105b can be connected with the connecting interconnection without damage to the other interconnection 106b.

As described above, the sixth embodiment relates to the FIB apparatus suitable for forming the connecting interconnection along the body diagonal without damage to the other interconnection. The FIB apparatus will be described in further detail below with reference to FIG. 14.

Figure 14:
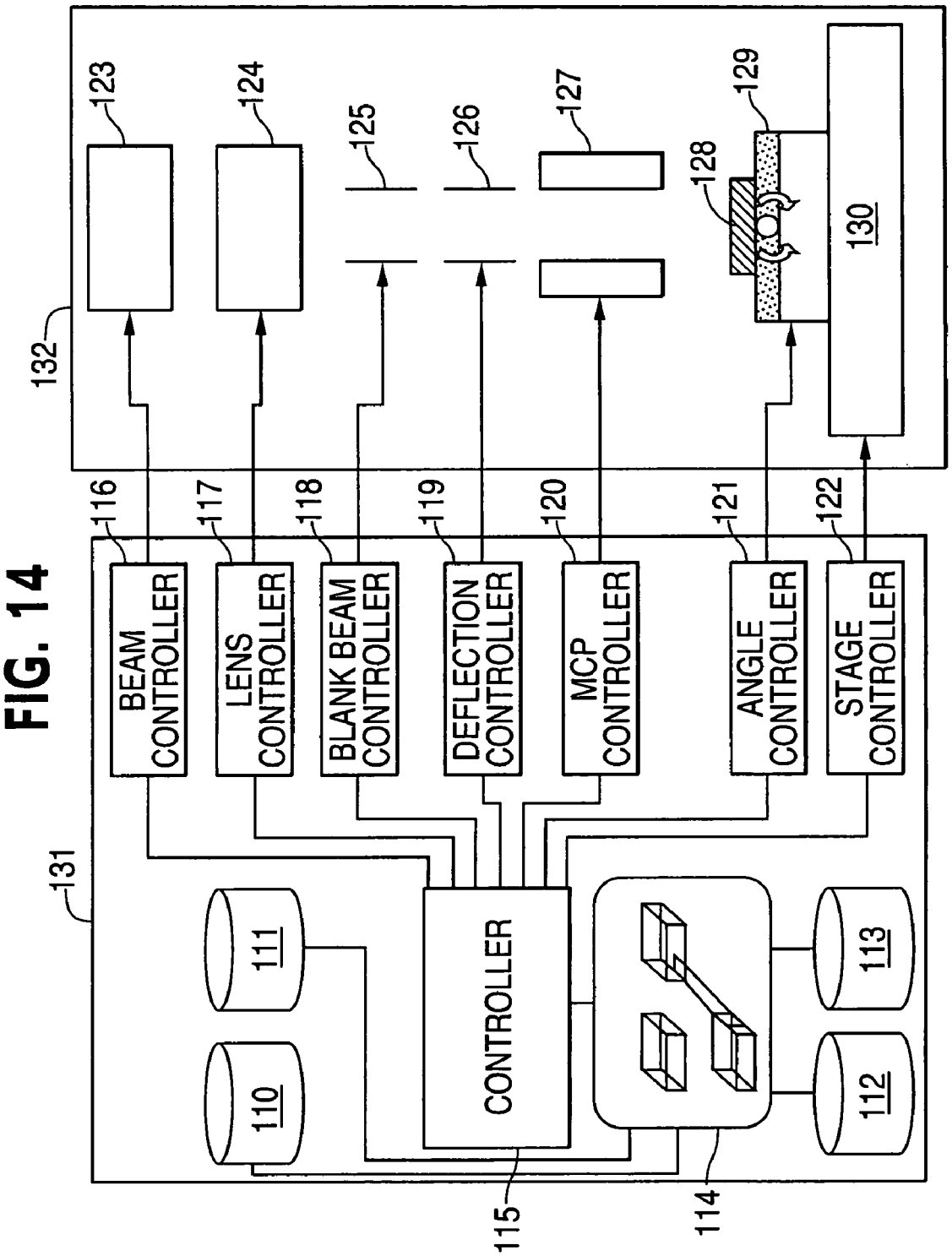
FIG. 14 is a drawing showing the configuration of a FIB apparatus according to the sixth embodiment.

FIG. 14 shows the FIB apparatus used for forming the connecting interconnection along the body diagonal according to the sixth embodiment. Like the FIB apparatus of the fifth embodiment, the FIB apparatus of this embodiment comprises a control unit 131 and a processing unit 132, and the processing unit 132 comprises a beam irradiation portion 123, a lens portion 124, a beam blank portion 125, a deflection portion 126, a MCP portion 127, an angle control portion 129, a stage portion 130, and a stage bed 133.

However, the control unit 131 comprises a data file 114 for a three-dimensional interconnection route information formed from a control program, CAD (computer aided design) data, and set value, and a temporary storage device 113 therefor in addition to the same components of the fifth embodiment (the controller 115, the beam controller 116, the lens controller 117, the beam blank controller 118, the deflection controller 119, the MCP controller 120, the angle controller 121, the stage controller 122, the CAD data storage device 110, the control program storage device 111, and the set value storage device 112). Also, when the predetermined points of the upper and lower interconnection layers are connected on the basis of the three-dimensional interconnection route information, the possibility of damage to another interconnection is checked during setting of the interconnection route of the connecting interconnection. When it is decided by checking that there is the possibility of damage, the FIB irradiation angle or direction with respect to the connection target point of the lower interconnection layer is changed.

Figure 15:
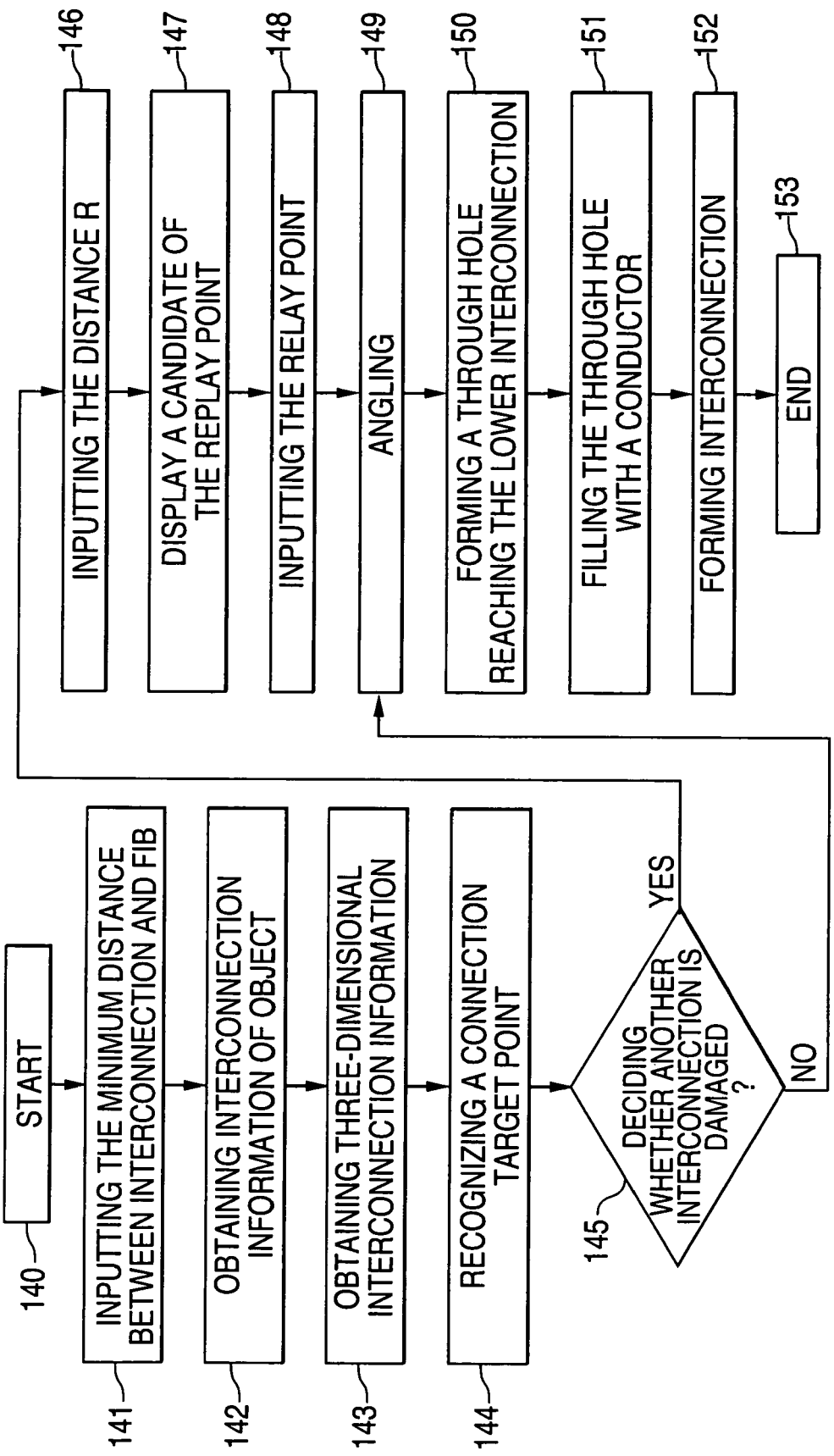
FIG. 15 is a flow chart showing a method for forming connecting interconnection according to the sixth embodiment.
Figure 16:
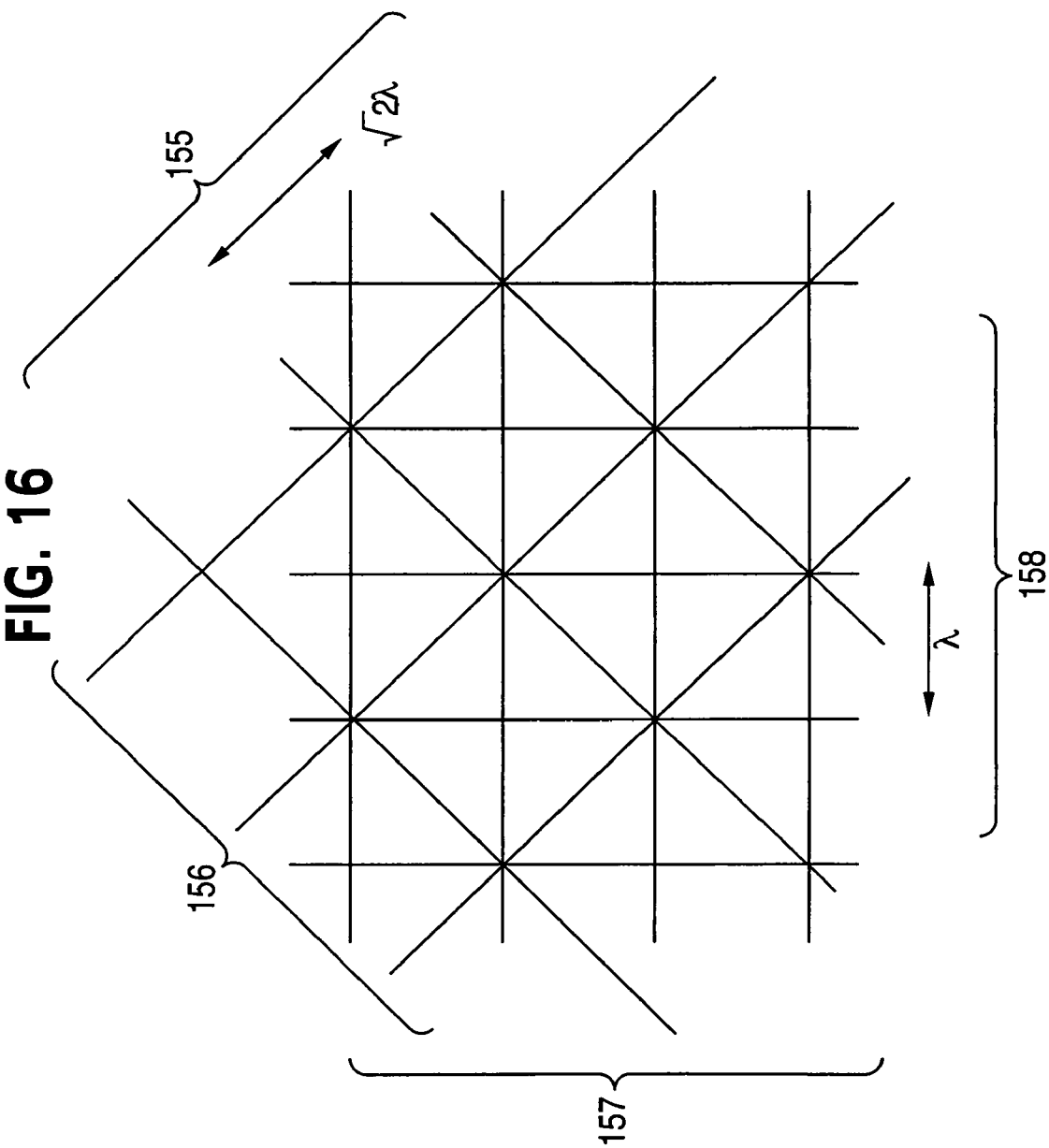
FIG. 16 is a plan view showing an example of conventional multilayer interconnection.

FIG. 15 is a flow chart showing the process for detecting another interconnection which may be damaged, and avoiding the other interconnection by the FIB apparatus shown in FIG. 14.

First, an object 128 to be processed which has a multilayer interconnection structure is set in the FIB apparatus at the start 140.

Next, in the step 141 of inputting the minimum distance between another interconnection and FIB, the minimum distance between another interconnection and FIB, which securely avoids damage to another interconnection, is input. The input minimum distance is stored as a set value in the set value storage device in the FIB apparatus.

Next, in the step 142 of obtaining interconnection information of the object to be processed, interconnection information of LSI is obtained from a CAD library. In the step 143 of obtaining three-dimensional interconnection information, three-dimensional interconnection route information is obtained.

Next, in the step 144 of recognizing a connection target point, connection target points of the lower and upper interconnection layers are recognized based on the LSI interconnection information and the three-dimensional interconnection route information, and a body diagonal between the two points is determined.

Next, in the step 145 of deciding whether another interconnection is damaged, on the basis of the position information of another interconnection from the LSI interconnection information and the three-dimensional interconnection route information, the information of the body diagonal and the FIB beam, and the minimum distance between another interconnection and FIB, it is decided whether or not another interconnection is damaged by FIB irradiation.

When it is decided that another interconnection is damaged, the process proceeds to the step 146 of inputting the distance R from the connection target point, and the input value of the distance R between the connection target point of the upper interconnection layer and the relay point is received. On the other hand, when it is decided that another interconnection is not damaged, the process proceeds to the angling step 149 in which the object to be processed is angled for forming a though hole.

Next, in the step 147 of displaying a candidate of the relay point, a candidate of the relay point within a region of R in radius from the connection target point of the upper interconnection layer, which causes no damage to another interconnection by FIB irradiation, is displayed.

Next, in the step 148 of inputting the relay point, the selected relay point is input.

Next, in the step 150 of forming a through hole reaching the lower interconnection layer, the object to be processed is angled. The angling step 150 is the same as the angling step shown in FIG. 10.

Next, in the step 151 of filling the through hole with a conductor, a through hole is formed to extent to the lower interconnection layer, and the through hole is filled with a conductor by the same step as shown in FIG. 10.

Next, in the step 152 of forming interconnection, interconnection for connecting the connection target point of the upper interconnection and the relay point is formed by a laser CVD process in a chamber into which the object is placed and a metal organic compound gas is introduced. Then, the process is finished at the end 153.

The FIB apparatus of the sixth embodiment has the effect that the FIB irradiation direction or angle from the connection target point of the lower interconnection layer is shifted to a direction or angle which causes no damage to another interconnection so that interconnection included in connecting interconnection for connecting the connection target points of the lower and upper interconnection layers can be formed along the body diagonal without damage to another interconnection.

The present invention provides a multilayer interconnection (or wiring) structure for a semiconductor device, the multilayer interconnection (or wiring) structure comprising connecting interconnection including interconnection along a body diagonal, for connecting two predetermined points with a short distance therebetween, the two predetermined points belonging to different interconnection layers of multilayer interconnection. In the multilayer interconnection structure, the connecting interconnection can be shortened to decrease the interconnection resistance and interconnection capacity of the connecting interconnection. The present invention also provides a method capable of easily forming the connecting interconnection in the multilayer interconnection structure. The present invention further provides a FIB apparatus capable of easily forming the connecting interconnection.

What is claimed is:

1. A method for producing a multilayer interconnection structure on a semiconductor substrate, said multilayer interconnection structure includes a diagonal interconnection for connecting between a first interconnection and a second interconnection and extending along first body diagonal direction with respect to first and second planes, comprising:
   recognizing said first body diagonal direction by determining said first interconnection and said second interconnection;
   recognizing an angle of said first body diagonal direction from a horizontal plane;
   inclining said semiconductor substrate so that said first body diagonal direction becomes vertical;
   forming a through hole in a interlayer insulation film between said first interconnection and said second interconnection along said body diagonal direction by first FIB irradiation; and
   filling said through hole with metal material by second FIB irradiation.

2. A method for producing a multilayer interconnection structure on a semiconductor substrate, said multilayer interconnection structure includes a diagonal interconnection for connecting between a first point of a first interconnection and a second point of a second interconnection and extending along a second body diagonal direction with respect to first plane and second planes, comprising;

recognizing said first body diagonal direction by determining said first point and said second point;

deciding whether an interconnection other than said first and second interconnections is damaged by FIB irradiation along said first body diagonal direction on a basis of a result of recognizing a first body diagonal direction;

determining a relay point having no possibility of damage to said interconnection other than said first and second interconnection so that one of said first and second points is replaced by said relay point when it is decided that said interconnection other than the first and second interconnections is damaged;

recognizing a second body diagonal direction when one of said first and second points is replaced by said relay point;

recognizing an angle of said second body diagonal direction from a horizontal plane;

inclining said semiconductor substrate so that said second body diagonal direction becomes vertical;

forming a through hole in a interlayer insulation film between said first interconnection and said second interconnection along said second body diagonal direction by first FIB irradiation; and filling said through hole with metal material by second FIB irradiation.

3. The method for producing a multilayer interconnection structure according to claim 2, wherein in said step of determining said relay point, a specified distance between said relay point and said one of said first and second points to be replaced is designated, and said relay point is determined within a circular region having said one of said first and second points at a center and said specified distance as a radius.

* * * * *

UNITED STATES PATENT AND TRADEMARK OFFICE
CERTIFICATE OF CORRECTION

| | | |
|---|---|---|
| PATENT NO. | : 7,514,355 B2 | Page 1 of 1 |
| APPLICATION NO. | : 11/149188 | |
| DATED | : April 7, 2009 | |
| INVENTOR(S) | : Syuji Katase et al. | |

It is certified that error appears in the above-identified patent and that said Letters Patent is hereby corrected as shown below:

Title Page, Column 2 (Other Publications), Line 2, change "Focuse" to --Focused--.

Signed and Sealed this

Twenty-eighth Day of July, 2009

JOHN DOLL
*Acting Director of the United States Patent and Trademark Office*